(12) United States Patent
Bawell et al.

(10) Patent No.: US 10,790,804 B2
(45) Date of Patent: Sep. 29, 2020

(54) MULTI-BIT CELL ATTENUATOR

(71) Applicants: Shawn Bawell, Amherst, NH (US); Jean-Marc Mourant, Dunstable, MA (US); Feng-Jung Huang, San Antonio, TX (US)

(72) Inventors: Shawn Bawell, Amherst, NH (US); Jean-Marc Mourant, Dunstable, MA (US); Feng-Jung Huang, San Antonio, TX (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 84 days.

(21) Appl. No.: 15/136,962

(22) Filed: Apr. 24, 2016

(65) Prior Publication Data

US 2016/0241216 A1   Aug. 18, 2016

Related U.S. Application Data

(62) Division of application No. 13/539,409, filed on Jun. 30, 2012, now Pat. No. 9,374,078.

(51) Int. Cl.

| | | |
|---|---|---|
| H03H 11/24 | (2006.01) |
| H01P 1/22 | (2006.01) |
| H03K 17/16 | (2006.01) |
| H03K 17/56 | (2006.01) |
| H03M 1/68 | (2006.01) |
| H01C 1/16 | (2006.01) |
| H01C 13/02 | (2006.01) |
| H03H 7/25 | (2006.01) |
| H03G 1/00 | (2006.01) |
| H03M 1/80 | (2006.01) |

(52) U.S. Cl.
CPC ............ *H03H 11/245* (2013.01); *H01C 1/16* (2013.01); *H01C 13/02* (2013.01); *H01P 1/22* (2013.01); *H03G 1/007* (2013.01); *H03H 7/25* (2013.01); *H03K 17/16* (2013.01); *H03K 17/56* (2013.01); *H03M 1/68* (2013.01); *H03M 1/808* (2013.01)

(58) Field of Classification Search
CPC ........ H03H 11/245; H01C 1/16; H01C 13/02; H01P 1/22
USPC .......................................................... 327/308
See application file for complete search history.

(56) References Cited

U.S. PATENT DOCUMENTS

| | | | | |
|---|---|---|---|---|
| 2004/0036462 | A1* | 2/2004 | Evers | H01P 1/15 323/369 |
| 2004/0217751 | A1* | 11/2004 | Nazarian | H03H 11/245 323/354 |
| 2010/0308933 | A1* | 12/2010 | See | H03F 1/565 333/32 |
| 2011/0025436 | A1* | 2/2011 | Hadji-Abdolhamid | H03J 5/24 334/55 |

* cited by examiner

*Primary Examiner* — Samuel S Outten
(74) *Attorney, Agent, or Firm* — Tracy Parris

(57) ABSTRACT

Hybrid-coding, multi-cell architecture and operating techniques for step devices provide advantages over binary-coded and thermometer-coded step devices by minimizing or avoiding glitches common in the transient response of binary-coded step devices and by minimizing or avoiding significant increases or degradation in one or more of area, package dimensions, pin counts, power consumption, insertion loss and parasitic capacitance common to thermometer-coded step devices having equivalent range and resolution.

20 Claims, 14 Drawing Sheets

MULTI-BIT CELL ATTENUATOR

CROSS-REFERENCE TO RELATED APPLICATIONS

This application is a divisional of and claims priority to U.S. patent application Ser. No. 13/539,409, filed Jun. 30, 2012, entitled "Multi-Bit Cell Attenuator," which is hereby incorporated by reference in its entirety as if fully set forth herein. This application is related to U.S. Pat. No. 8,704,684, entitled "Hybrid-Coding for Improving Transient Switch Response in a Multi-Cell Programmable Apparatus," which is hereby incorporated by reference in its entirety as if fully set forth herein.

TECHNICAL FIELD

The present invention generally relates to step devices. More particularly, the invention relates to reducing glitches and insertion loss in step attenuator devices.

BACKGROUND

Variable step devices use programmable switches to step values at a certain resolution over a certain range. Such devices include step attenuators, variable resistors, switched capacitors and switched inductors. An example of a step attenuator (e.g. digital step attenuator or DSA) is a radio frequency (RF) signal attenuator. These switching devices are usually designed with binary or thermometer coded switches to step a certain resolution value over a certain range of values. One or more switches are used to switch cells in and out of operation. Each switch is typically a transistor, e.g., a metal oxide field effect transistor (MOSFET). FIG. 1A illustrates a typical configuration of a cell in a step device. A cell $m_i$ comprises a switch $s_i$ that switches a component or circuit $c_i$ in and out of operation between nodes x and y. One or more cells $m_i$ may be used in binary and thermometer coded step devices.

However, there are problems with both binary and thermometer coded step devices. While binary coding permits simple, compact design and control of switches, it often has an undesirable consequence of signal glitches during switching due to unequal turn ON and turn OFF times. A glitch is defined as an indeterminate system level that occurs during a switch event involving a plurality of cells m, where a cell is a physical rather than a mere logical division in a variable step device. Glitch headroom is defined as the difference between a minimum system level (e.g. zero) and a desired system level. Glitches can occur in any step device. Such glitches not only degrade system performance, but may also be instantaneously or cumulatively destructive to step devices or other components. Glitches may impact device reliability, depending on the voltage and power handling ratings of system components.

Consider basic operation of a MOSFET as a switch. When biased with positive gate voltage VGS (where VDS=0V), a low-resistance channel forms between drain and source nodes of the MOSFET and, as a result, the switch is ON or CLOSED. Conversely, when biased with negative gate voltage VGS (where VDS=0V), no channel is present between the drain and source nodes and, as a result, the switch is OFF or OPEN.

Several problems may develop with step devices driven by MOSFET switches. First, MOSFET switches may behave nonlinearly. When an AC signal is applied to the drain node with source grounded, or vice versa, of an ON device, channel resistance is generally low enough that voltage drop across the drain and source nodes is negligible. However, when an AC signal is applied to the drain node with source grounded, or vice versa, of an OFF device, channel resistance is generally high enough that the entire signal voltage drops across the drain and source nodes. When the voltage across an OFF device exceeds the device breakdown voltage, the device becomes highly nonlinear.

Consider FIG. 1B, which illustrates a typical bridged tee attenuator configuration implementing a cell $m_i$ in a step attenuator device. Attenuator cell $m_i$ comprises bypass transistor N0, attenuation transistor N1, bridge resistor Rbridge, first tee resistors R1, second tee resistor R2, gate control resistors Rgate and drain-source resistor Rds. Attenuation transistor N1 has a drain-source resistance Rds. N-type bypass transistor N0 is controlled by bypass control signal CTLb through a gate resistor Rgate. N-type attenuation transistor N1 is controlled by attenuation control signal CTL through a gate resistor Rgate. RF input provided to input node RF1 is coupled to the source node of bypass transistor N0 and first nodes of bridge resistor Rbridge and a first tee resistor R1. RF output at output node RF2 is coupled to the drain node of bypass transistor N0 and second nodes of bridge resistor Rbridge and a first tee resistor R1.

Basically, attenuation is OFF when control signals CTL and CTLb turn bypass transistor N0 ON and attenuation transistor N1 OFF while attenuation is ON when control signals CTL and CTLb turn bypass transistor N0 OFF and attenuation transistor N1 ON. Assuming bypass transistor N0 is lossless and assuming the resistance of attenuation resistance in the OFF state is much greater than the resistance of second tee resistor R2, when bypass transistor N0 is ON and attenuation transistor N1 is OFF, no current flows through second tee resistor R2 or attenuation transistor N1. As a result, all voltage in an RF signal applied to input node RF1 is dropped across attenuation transistor N1, whose source node is coupled to ground. An RF signal voltage greater than a breakdown voltage may cause bridged tee attenuator 100 to behave nonlinearly.

Second, as shown in FIG. 1, when designed to operate at relatively high frequencies, a MOSFET utilizes a gate control resistor, Rgate to preserve switch performance. The RC time constant formed by the gate resistor Rgate and a gate capacitance is designed to be much longer than the period of the high frequency signal in order to preserve signal integrity. However, the RC time constant slews the switch response when bias, in the form of a step function, is applied to the gate node. Since the gate capacitance is bias dependent, switches may exhibit unequal turn ON and turn OFF times. A turn OFF time may be longer than a turn ON time. When multiple binary coded cells are turning ON and OFF, a glitch may occur. The longer the range and the larger the step values in a binary coded step device, the larger the glitch problem becomes.

Binary-coded step devices consist of a sequence of binary increment value cells selectively turned on and off directly with a binary code to obtain a desired value. For example, FIG. 2A illustrates a typical binary coded step attenuator device. As shown in FIG. 2A, for a binary-coded variable step device with a range of 31.75 and a resolution of 0.25 directly controlled by a 7-bit binary code, the binary incremented values of each of seven cells M1-M7 have binary increment values 0.25, 0.5, 1, 2, 4, 8 and 16. The cells may have magnitude or relative magnitude units, such as decibels (dB). The resolution of this example would be 0.25 and the range would be 0 to 31.75, which is achieved in 127 steps between 128 states. The problem is that the greater the magnitude of cells being switched the greater the glitch headroom and the greater the magnitude of the glitch.

For example, the value of 15.75 is achieved with cells M1-M6 ON and cell M7 OFF while the value of 16 is achieved with cells M1-M6 OFF and cell M7 ON. As shown in FIG. 2B, stepping from 15.75 to 16 or vice versa will result in an undesirable glitch that impacts system linearity and reliability. Of course there are other switch events that may give rise to large glitches, e.g., 3.75 to 4, 7.75 to 8, 11.75 to 12, 19.75 to 20, 23.75 to 24, 27.75 to 28 and vice versa. While glitches may occur in other transitions, smaller glitches, such as from 0.25 to 0.5 or 0.75 to 1, have less glitch headroom and, therefore, are of less concern.

FIG. 2B illustrates a step response and glitch problem in a typical binary coded step attenuator device as shown in FIG. 2A before and after a trigger event. The x-axis represents time while the y-axis represents cell units in decibels. In this example, the trigger event is switching from 15.75 dB attenuation to 16 dB attenuation by switching cells M1-M6 from ON to OFF and cell M7 from OFF to ON. Before the trigger event, the output of the 7-bit binary coded attenuator is 15.75 dB, during the switch event there is a glitch and after the switch event the output of the 7-bit binary coded attenuator is 16 dB. The glitch headroom is 16 dB. Considering that the attenuation level should move from 15.75 dB to 16 dB, the switching event results in a positive glitch above 15.75 dB as switches M1-M6 turn OFF and a negative glitch below 16 dB as switch M7 turns ON before switches M1-M6 are completely OFF. In this example, the positive glitch is shown as 8 dB from 16 dB to 8 dB, although it could be larger or smaller in particular implementations. The negative glitch is shown as approximately 3 dB from 16 dB to approximately 19 dB, although it could be larger or smaller in particular implementations. Worst case, depending on switch control and switch components, a glitch could be 16 dB in one direction (positive or negative), which is equivalent to a change in signal magnitude (e.g. of signal voltage) by a multiple of 6.3 and a change in signal power by a multiple of approximately 40.

Glitches not only degrade system performance, but may also be instantaneously or cumulatively destructive to step devices or other components. As one example, consider the glitch shown in FIG. 2B in units of capacitance rather than attenuation in decibels. Since a capacitor's impedance is inversely proportional to capacitance, a glitch from 16 to 8 would cause a momentary doubling of impedance, which could result in a momentary doubling of signal magnitude that would negatively impact linearity and could negatively impact component reliability. As a second example, assume a 7-bit binary-coded step attenuator precedes an amplifier with a 1 dB-compression point of +11 dBm. Further, assume signal power into the attenuator is +25.75 dB and assume the attenuator is set to attenuate by 15.75 dB so that power out of the attenuator into the amplifier is +10 dBm. If this attenuator switches binary coded cells from 15.75 dB to 16 dB to adjust the amplifier's input power to +9.75 dBm, a glitch during the switch interval causes attenuation to substantially decrease from 15.75 dB before settling to 16 dB. As shown in FIG. 2B, if the positive glitch is 8 dB from 16 dB to 8 dB then signal output power rises to +17.75 dBm before settling to +9.75 dBm. Obviously, +17.75 dBm is substantially above the amplifier's 1 dB compression point of +11 dB. The glitch causes a brief amplifier input power surge exceeding the amplifier's linear region, contributing non-linear behavior to an otherwise linear system and potentially impacting component reliability.

One solution to the glitch problem in binary-coded step devices is thermometer coded step devices. FIG. 3A illustrates a typical thermometer coded step attenuator device. Compared to a binary coded step device with a resolution of 0.25 and a range of 31.75 having seven cells M1-M7 and 7-bit control, a thermometer coded step device with a resolution of 0.25 and a range of 31.75 would have 127 cells M1-M127 and 127 control lines, where the number of bits b is 127. The value of each cell n is the resolution, i.e., 0.25. Control is simple. Each cell is turned on or off by a dedicated control signal. While there could be 127 external control signals provided to 127 pins, a binary control signal provided to seven pins can be decoded internally into thermometer coding of 127 internal control signals.

Thermometer-coding gets its name by equating the incremental rise and fall of mercury in a thermometer as temperature increases or decreases to the incremental rise or fall in the number of cells turning on and remaining on or turning off and remaining off while incrementing or decrementing a thermometer-coded step device. Cell values do not define the difference between thermometer and binary coding. Rather, cell control in turning on and leaving on or vice versa each cell or alternating during a consecutive count defines the difference. FIG. 3B illustrates a step response of a typical thermometer coded step attenuator device, such as the one illustrated in FIG. 3A. As illustrated in FIG. 3B, glitches do not occur because cells are not being turned both ON and OFF during the same trigger event. For example, the value of 15.75 is achieved with cells M1-M63 ON and cells M64-M127 OFF while the value of 16 is achieved with cells M1-M64 ON and cells M65-M127 OFF. As shown in FIG. 3B, since only one additional cell is turned ON, a switch event from 15.75 to 16 or vice versa will not result in an undesirable glitch.

However, like binary-coded step devices, thermometer-coded step devices suffer design and performance problems. While thermometer-coded step devices eliminate glitches, thermometer-coded step devices require more cells, which consumes more area, causes greater insertion loss and causes more parasitic capacitance due to additional control signal routing. For example, a 128 stage thermometer-coded step attenuator would consume an inordinate, cost-ineffective amount of chip area and could have 18 times, more or less, parasitic capacitance than its seven stage binary-coded counterpart. This amount of parasitic capacitance would be difficult to manage and its loading on the circuit would result in severe degradation in terms of insertion loss and attenuation error. As a result, thermometer coded step devices are generally limited in terms of the number of cells and range. So, while there are no glitches, thermometer-coded step devices suffer substantial design and performance degradation problems. Therefore, both types of coding (i.e., binary and thermometer coding) are unsatisfactory for RF and other applications.

Thus, there is a need for an improvement that minimizes or eliminates glitches in the transient response of switching devices without significant increases or degradation in one or more of area, package dimensions, pin counts, power consumption, insertion loss and parasitic capacitance.

SUMMARY

This Summary is provided to introduce concepts in a simplified form. These concepts are described in greater detail below in the sections entitled Detailed Description Of Illustrative Embodiments, Brief Description of the Drawings, Claims, and in the figures. This Summary is not intended to identify key or essential features of the described or claimed subject matter, nor limit the scope thereof.

Hybrid-coding, multi-cell architecture and operating techniques for step devices provide advantages over binary-coded and thermometer-coded step devices by minimizing or avoiding glitches common in the transient response of binary-coded step devices and by minimizing or avoiding significant increases or degradation in one or more of area, package dimensions, pin counts, power consumption, insertion loss and parasitic capacitance common to thermometer-coded step devices having equivalent range and resolution.

A device in accordance with an embodiment of the invention may comprise, for example, a hybrid-coded or hybrid-codable step device having a plurality of cells, where each cell is selectable to provide one or more of a plurality of selectable or programmable steps in a range at a resolution of the step device. At least one of the plurality of cells, e.g., a first cell, is a variable cell selectable to provide a plurality of the plurality of selectable steps, where a step may be either or both incrementing and decrementing. Each variable cell has its own range and resolution, which may be the same or different between variable cells. Cell range is a subset of the device range. Cell resolution may be the same or different compared to the device resolution. For a hybrid-coded step device having a given range and resolution, a ratio of the range to the largest selectable step value can be determined. Ratios can also be determined for equivalent binary coded and thermometer coded devices (having equivalent range and resolution).

For example, assuming a range of 31.75 and a resolution of 0.25, 16 would be the largest selectable binary-coded step value while 0.25 would be the largest selectable thermometer-coded step value. At a range of 31.75, the ratio would be nearly 2:1 for a binary-coded step device and 127:1 for a thermometer-coded step device. The ratio for a hybrid-coded step device would be between these two ratios, greater than a ratio for a binary coded step device and less than a ratio for a thermometer-coded step device. For example, in a hybrid-coded step device, a fixed cell may step 0.25, a variable cell may step from 0 to 1.5 in steps of 0.5 (i.e. a uniform cell resolution of 0.5 and a cell range of 1.5) while five other variable cells may step from 0 to 6 in increments of 2 (i.e. a uniform cell resolution of 2 and a cell range of 6), such that 2 is the largest selectable step value. Therefore, in one embodiment of a hybrid-coded step device having a range of 31.75 and resolution of 0.25, a ratio of the range to the largest selectable step value would be 31.75:2 or nearly 16:1.

An advantage of smaller steps is that there is less glitch headroom and, therefore, smaller glitches, and there may be fewer occurrences of glitches due to fewer simultaneous on-off switching of step values. An advantage of having far fewer cells than a thermometer-coded d step device is the avoidance or minimization of significant increases or degradation in one or more of area, package dimensions, pin counts, power consumption, insertion loss and parasitic capacitance.

Hybrid-coded step devices may implement any parameter (s), including but not limited to attenuation, impedance, resistance, capacitance and inductance. Thus, cells may divide any parameter space into a plurality of subsets. Each selectable cell and step within a cell may be implemented by any selectable technique. In some embodiments, each cell or step within a cell may be implemented as one or more selectable transistor switches that couple and decouple components in a cell, whether single or multi-cell. The components, e.g., resistors, may be fixed or variable. Units of step values may be any kind, including but not limited to magnitude and relative magnitude, e.g., decibels (dB). Cells may be variable or a hybrid of [a] fixed cells providing only one step of the plurality of selectable steps and [b] variable cells providing a plurality of steps of the plurality of selectable steps. Steps within a variable cell may be variously referred to as steps, intra-steps, unit cells, stages, cell elements or cell components. One or more cells may have a bypass to bypass or disable a cell.

For example, a bypass may pass a signal through a cell without modification, although perhaps with some insertion loss. An advantage of variable cells is that a plurality of steps may share a single bypass, thereby minimizing insertion loss. Intra-cell steps may be selected in the alternative or they may be combined or accumulated. Stages or unit cells may be independent or dependent on one another. Steps within a variable cell may have a common or a variable resolution between steps. For example, a variable cell with common resolution may step from 0 to 0.5 to 1.0 to 1.5 where the largest step is 0.5 while a variable cell with varying resolution may step from 0 to 0.5 to 1.0 to 2.0 to 4.0 where the largest step is 2. Resolution, range and step values for variable cells may be fixed or may be statically or dynamically variable, e.g., through the use of variable components for calibration or programming.

For variable cells, there are two perspectives to consider, intra-cell and inter-cell. Inter-cell coupling that externally couples cells may be serial, parallel or a combination thereof. Intra-cell coupling of intra-cells or stages internal to variable cells may be serial, parallel or a combination thereof. Intra-cell coding of a plurality of variable cells in a step device may be the same or different. A fixed cell has no intra-cell coding. Some variable cells may be thermometer-coded while others may be binary-coded while still others may have other coding. Inter-cell coding of cells in a step device may be the same or different than intra-cell coding of variable cells. A control code may be decoded, e.g., using a map or table, to translate a compact code to control selection of fixed and variable cells according to a desired state of the step device.

Using the above example of a first fixed cell of 0.25, a second variable cell stepping from 0 to 1.5 in steps of 0.5 and five variable cells three thru seven stepping from 0 to 6 in steps of 2 for a step device range of 31.75 with uniform step resolution of 0.25, the second cell's intra-coding may be thermometer coding since each time the second cell is used during a consecutive step each of its three stages are turned on and remain on and vice versa. However, since the second cell is alternately turned on and off during a consecutive step from 0 to 31.75, it's inter-cell coding is not thermometer. It also is not binary, although it may be considered binary skipping some counts. Given 128 states, a compact 7-bit control code defining the state of the step device could be decoded to control the state of each cell. In this example, there are two states in the first cell and four states in cells two thru seven. Each state may enable and disable different components, e.g., transistor switches that couple and decouple components, in the cells. Decoding may be implemented in many ways, e.g., intra-cell logic and/or inter-cell logic implemented in analog or digital hardware or a combination of hardware and software, such as gates, multiplexer, translation table or map, etc.

Hybrid coding is defined as any coding that is not strictly thermometer or strictly binary coding, although one, both or neither of thermometer and binary coding may be used in intra-cell coding and inter-cell coding in a step device. Hybrid coding may be combined with multi-cells or variable cells. In a fixed cell (i.e. single step or single value cell or single-cell), range and resolution are one in the same during operation. In a variable cell (i.e. multi-step or multi-value cell or multi-cell), during operation, range and resolution may be the same, changing together, or range may be different from resolution. Intra-cell and inter-cell or device resolution between steps depends on step control applied to a step device and may be uniform or non-uniform intra-cell and inter-cell.

A method in accordance with an embodiment of the invention may comprise, for example, operating a hybrid-coded or hybrid-codable step device having a plurality of cells (e.g. first cell, second cell), where each cell is selectable to provide one or more of a plurality of selectable steps in the step device. At least one cell (e.g. first cell) is a variable cell selectable to provide a plurality of the plurality of selectable steps. The second cell and any other cells may be fixed or variable cells. A mixture of fixed and variable cells is referred to as a hybrid of cells. The step device is stepped to a first level by selecting or deselecting a first step in the first cell. The step device is stepped to a second level by selecting or deselecting a second step in the first cell. The step device is stepped to a third level by selecting or deselecting a first step in the second cell in combination with selecting the first or second step in the first cell. The step device may be stepped to a fourth level by selecting a bypass of the first cell. Since an intra-cell coding of the first cell may be the same or different than an intra-cell coding of the second cell, the method may comprise applying a first code (e.g. thermometer code) to select steps in the first cell and applying a second code (e.g. binary or other code) to select steps in the second cell. Inter-cell and intra-cell codes may be decoded from a control code. As a result, the method may comprise decoding a control code for the step device into the first code for the first cell and into the second code for the second cell.

Step devices comprising variable step cells, i.e., multi-step value cells or multi-cells, as well as the multi-cells themselves may be implemented by any controllable or selectable technique. Regarding step attenuator devices, a device in accordance with an embodiment of the invention may comprise, for example, a step attenuator having at least one cell, where each cell is selectable to provide one or more cell attenuation levels, including at least one multi-cell attenuator. A multi-cell attenuator in accordance with an embodiment of the invention may comprise, for example, a plurality of first attenuation arms between node set A and a plurality of second attenuation arms between node set B, where node set A and node set B are different. Each of the plurality of first attenuation arms and each of the plurality of second attenuation arms are selectable to enable or disable them. A plurality of attenuation levels may be provided by the multi-cell attenuator by selecting a plurality of different combinations comprising at least one of the plurality of first attenuation arms and at least one of the plurality of second attenuation arms. Arms may be selected in combination, alternatively or a combination thereof to provide selected step values. Each of the plurality of combinations of arms that provide an attenuation level are referenced as a unit cell or stage regardless whether there is a logical or physical division of components between each attenuation level.

Each set of selectable attenuation arms may be configured in serial, in parallel or a combination thereof between a node set. For example, in some embodiments, a plurality of first attenuation arms may be configured in parallel between node set A and the plurality of second attenuation arms may be configured in parallel between node set B. In some embodiments, the plurality of first attenuation arms may comprise a plurality of series arms and the plurality of second attenuation arms may comprise a plurality of shunt arms in a variable tee, bridged tee or pi attenuator. In some embodiments, the plurality of first attenuation arms may comprise a plurality of bridge arms and the plurality of second attenuation arms may comprise a plurality of shunt arms in a variable bridged tee attenuator. In some of many possible embodiments, there may be more than two sets of attenuation arms.

For example, in a pi attenuator configuration having three arms and three sets of nodes, a pi attenuator may comprise three sets of selectable attenuation arms. In some embodiments, one or more cells, whether single or multi-cells, in a step attenuator may comprise a bypass attenuation arm. A bypass arm may be selected to bypass attenuation in a particular cell. An advantage of multi-cells is that a plurality of cells or attenuation steps share a bypass arm, which limits insertion loss. Selectable attenuation arms may be selected in any combination to step attenuation levels. For example, in some embodiments, an attenuation level is stepped by decreasingly combining arms in the plurality of the first attenuation arms and increasingly combining arms in the plurality of second attenuation arms or vice versa depending on the direction of the step.

In some embodiments, cells may handle the same signal level and power while in other embodiments some cells may be configured to handle higher signal or power levels than other cells. For example, in a step attenuator comprising a plurality of cells where a first cell is configured to receive a signal before a second cell, the first cell may be configured to handle a higher signal power or a higher signal level than the second cell. In some embodiments, increased signal and power handling may be accomplished by stacking transistors in one or more of the first attenuation arm, the second attenuation arm, the bypass attenuation arm or other arm of an attenuation cell, whether single or multi-cell.

As with any step device embodiment, step attenuator device embodiments may comprise a plurality of cells, which may be multi-cells or a combination of single and multi-cells. Each attenuation step between each of the plurality of multi-cell attenuation levels may be the same or different. Intra-cell coding of a multi-cell may be the same or different compared to intra-cell coding of another multi-cell. Intra-cell coding of a multi-cell may be the same or different compared to inter-cell coding of a step attenuator.

Cell resolution, range and step values for each multi-cell, and therefore for the step device, may be fixed or may be statically or dynamically variable, e.g., through the use of variable components for calibration or programming. For example, variable resistors may be deployed in one or more arms or in other components of a multi-cell for programming or calibration.

Each selectable step may be implemented by any technique. In some embodiments, each attenuation arm may be implemented as one or more transistor switches selectable by at least one control signal that couple and decouple components in a cell, whether single or multi-cell. The components, e.g., resistors, may be fixed or variable.

A method in accordance with an embodiment of the invention may comprise, for example, operating a step attenuator having at least one cell, where each cell is selectable to provide one or more of a plurality of selectable attenuation steps in the step attenuator. At least one cell (e.g. first cell) is a variable or multi-cell attenuator selectable to provide a plurality of the plurality of selectable attenuation steps. A multi-cell attenuator in accordance with an embodiment of the invention may comprise, for example, a plurality of first attenuation arms between node set A and a plurality of second attenuation arms between node set B. The step attenuator device is stepped to a plurality of levels by selecting or deselecting a plurality of different combinations of the first and second attenuation arms in the first cell. The step attenuator device is stepped to a first attenuation level by selecting in the first cell a first combination of at least one of a plurality of first attenuation arms between node set A and at least one of a plurality of second attenuation arms between node set B. The step attenuator device is stepped to a second attenuation level by selecting or deselecting in the first cell a second combination of at least one of the plurality of the first attenuation arms between node set A and at least one of the plurality of the second attenuation arms between node set B.

A second cell, and any other cells in a plurality of cells in the step attenuator, may be fixed or variable. The step attenuator device is stepped to a third attenuation level by selecting or deselecting the second cell in combination with the selection of the first or second combination in the first cell. The step device may be stepped to a plurality of levels by selecting a combination of levels in a plurality of cells, whether fixed or variable. The step device may be stepped to a fourth attenuation level by selecting a bypass of the first cell. Attenuation levels, including zero, may also be obtained by bypassing one or more cells. Since an intra-cell coding of one multi-cell may be the same or different than an intra-cell coding of the another multi-cell, the method may comprise applying a first code (e.g. thermometer code) to select steps in the first cell and applying a second code (e.g. binary or other code) to select steps in the second cell. Inter-cell and intra-cell codes may be decoded from a control code. As a result, the method may comprise decoding a control code for the step attenuator device into the first code for the first cell and into the second code for the second cell.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments of the present invention and, together with the description, further serve to explain the principles involved and to enable a person skilled in the relevant art(s) to make and use the disclosed technologies. However, embodiments of the invention are not limited to the specific implementations disclosed herein. Unless expressly indicated, each figure represents a different embodiment and components in each embodiment are intentionally numbered differently compared to potentially similar components in other embodiments.

DETAILED DESCRIPTION OF ILLUSTRATIVE EMBODIMENTS

Figure 1A:
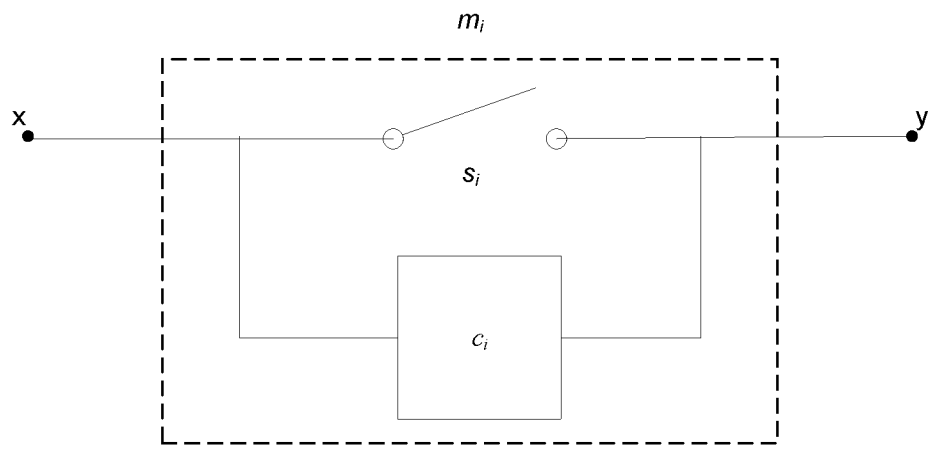
FIG. 1A illustrates a typical configuration of a cell in a step device.
Figure 1B:
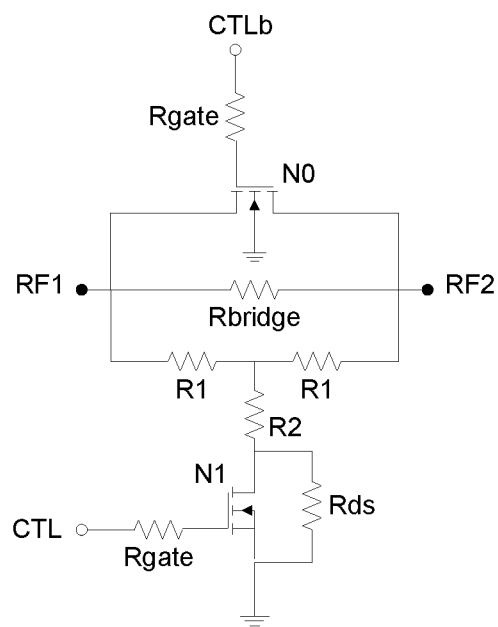
FIG. 1B illustrates a typical bridged tee attenuator configuration implementing a cell in a step attenuator device.

Reference will now be made to embodiments of the invention, examples of which are illustrated in the accompanying drawings. While the technology will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example embodiment," or the like, indicate that the embodiment described may include a particular feature, structure, characteristic or step, but every embodiment may not necessarily include the particular feature, structure, characteristic or step. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Unless specifically stated otherwise, terms such as "sampling," "latching," "determining," "selecting" "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device. The terms "logic," "function," "step," and the like refer to functionality that may be implemented by hardware (digital and/or analog) or a combination of hardware, software and/or firmware. Unless specifically indicated, described and claimed functionality may be implemented by hardware (digital and/or analog) or a combination of hardware, software and/or firmware. The term "programmable" and the like refer to functionality permitting definition or selection of functionality to vary performance of logic from one embodiment to the next, whether one-time or any number of times such as by reprogrammable functionality. Logic may be referred to as being enabled, disabled, high, low, on, off and the like.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection or though an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components.

Hybrid-coding, multi-cell architecture and operating techniques for step devices provide advantages over binary-coded and thermometer-coded step devices by minimizing or avoiding glitches common in the transient response of binary-coded step devices and by minimizing or avoiding significant increases or degradation in one or more of area, package dimensions, pin counts, power consumption, insertion loss and parasitic capacitance common to thermometer-coded step devices having equivalent range and resolution.

A step device is a device that steps incrementally or discretely rather than changing continuously. A step refers to both incrementing and decrementing. A step device may be comprised of one or both fixed cells and variable cells. A step device has a range and a resolution. Range is the difference between the minimum and maximum cumulative or aggregate value of all steps provided by fixed and/or variable cells in the step device. Resolution is difference between two consecutive steps. Resolution may be uniform or non-uniform across the range of a step device.

Hybrid-coded step devices may implement any parameter (s), including but not limited to attenuation, impedance, resistance, capacitance and inductance. Thus, cells may divide any parameter space into a plurality of subsets. Units of step values may be any kind, including but not limited to magnitude and relative magnitude, e.g., decibels (dB).

Hybrid coding is defined as any coding that is not strictly thermometer or strictly binary coding, although one, both or neither binary and thermometer coding may be used in intra-cell coding and inter-cell coding for a hybrid-coded step device.

A fixed step cell or fixed cell is a single value cell or single-cell that provides a single step in a step device. In a fixed cell, cell range and resolution converge as one in the same to provide only one step. A fixed cell, where cell range and resolution are dynamically fixed during operation, may vary statically, e.g., for calibration purposes.

A variable step cell or variable cell is a cell that is dynamically variable, i.e., variable during operation, to provide multiple steps in a step device. As such, a variable cell is a multi-value cell or multi-cell. Each variable cell has a cell resolution and a cell range that are different. Each cell range is a subset of the step device range. Cell resolution may be uniform or non-uniform across cell range, which means cell steps may be uniform or non-uniform. Cell resolution may be the same or different compared to the device resolution. Each step in a variable cell is variously referred to as a step, intra-step, unit cell, stage, cell element or cell component. Depending on variable cell architecture and programming, stages or unit cells may be independent of one another, e.g., selected in the alternative, or dependent on one another, e.g., selected in combination to provide step values.

Intra-cell refers to internal cell design and operation while inter-cell refers to external cell design and operation between cells. Intra-cell coding may be the same or different between cells. Inter-cell coding may be the same or different than an intra-cell coding.

A device in accordance with an embodiment of the invention may comprise, for example, a hybrid-coded step device having a plurality of cells, where each cell is selectable to provide one or more of a plurality of selectable or programmable steps in a range at a resolution of the step device. At least one of the plurality of cells, e.g., a first cell, is a variable cell selectable to provide a plurality of the plurality of selectable steps. Cells may be variable or a hybrid of [a] fixed cells providing only one step of the plurality of selectable steps and [b] variable cells providing a plurality of steps of the plurality of selectable steps.

Each variable cell has its own range and resolution, which may be the same or different between variable cells. Cell range is a subset of the device range. Cell resolution may be the same or different compared to the device resolution. Steps within a variable cell may have a common or a variable resolution between steps. For example, a variable cell with common resolution may step from 0 to 0.5 to 1.0 to 1.5 where the largest step is 0.5 while a variable cell with varying resolution may step from 0 to 0.5 to 1.0 to 2.0 to 4.0 where the largest step is 2. Resolution, range and step values for variable cells may be fixed or may be statically or dynamically variable, e.g., through the use of variable components for calibration or programming.

For a hybrid-coded step device having a given range and resolution, a ratio of the range to the largest selectable step value can be determined. Ratios can also be determined for equivalent binary coded and thermometer coded devices (having equivalent range and resolution). In a hybrid-coded step device, a ratio of the device range to a largest selectable step value of the plurality of selectable steps at the device resolution is: [a] greater than a ratio of the range to a largest selectable step value in a binary coded step device at same resolution and range and [b] less than a ratio of the range to a largest selectable step value in a thermometer coded step device at the same resolution and range.

Figure 2A:
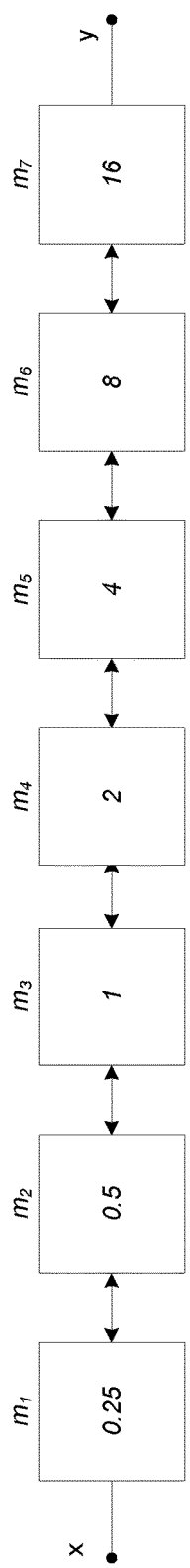
FIG. 2A illustrates a typical binary coded step attenuator device.
Figure 2B:
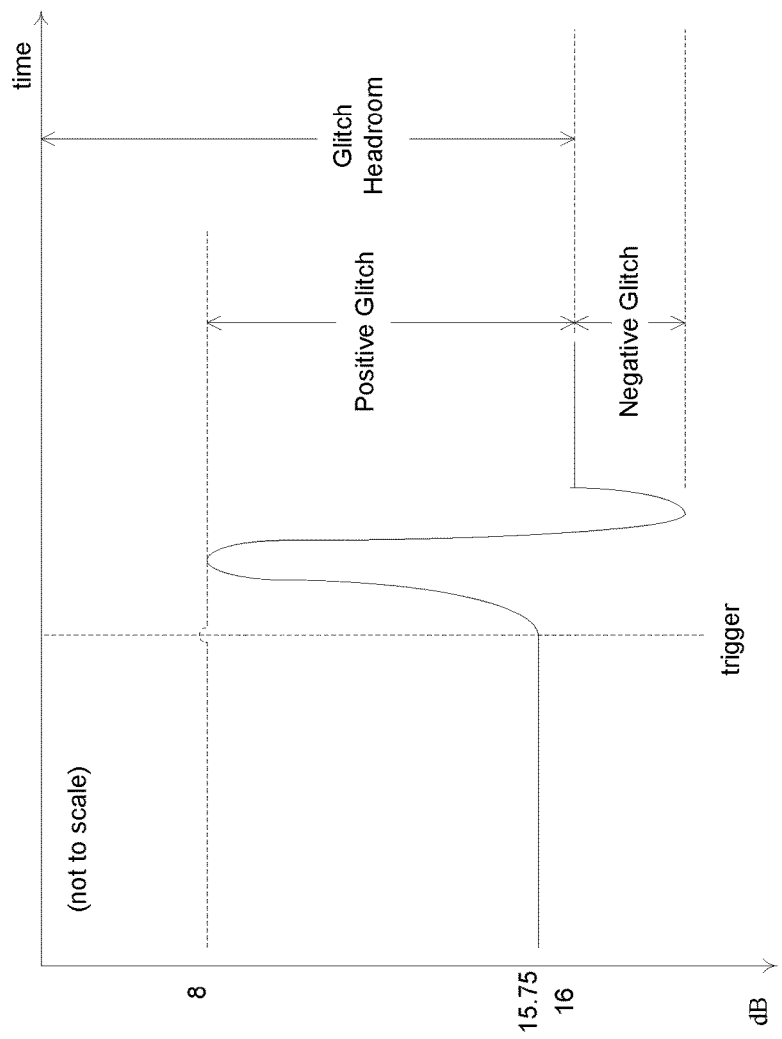
FIG. 2B illustrates a step response and glitch problem in a typical binary coded step attenuator device.
Figure 3A:
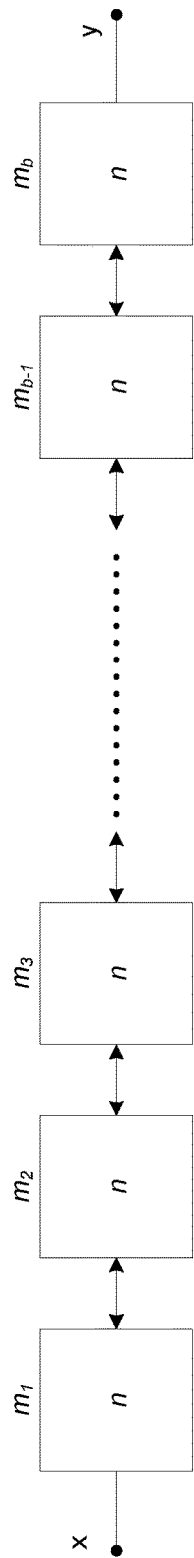
FIG. 3A illustrates a typical thermometer coded step attenuator device.
Figure 3B:
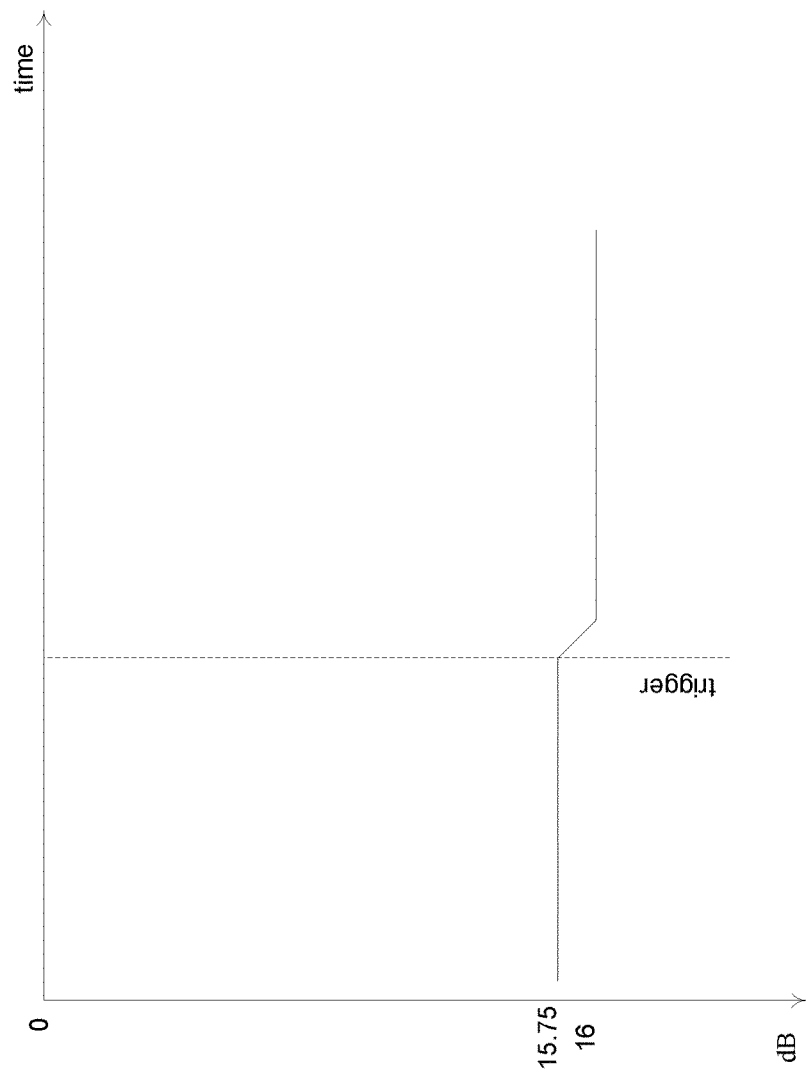
FIG. 3B illustrates a step response of a typical thermometer coded step attenuator devices.
Figure 4A:
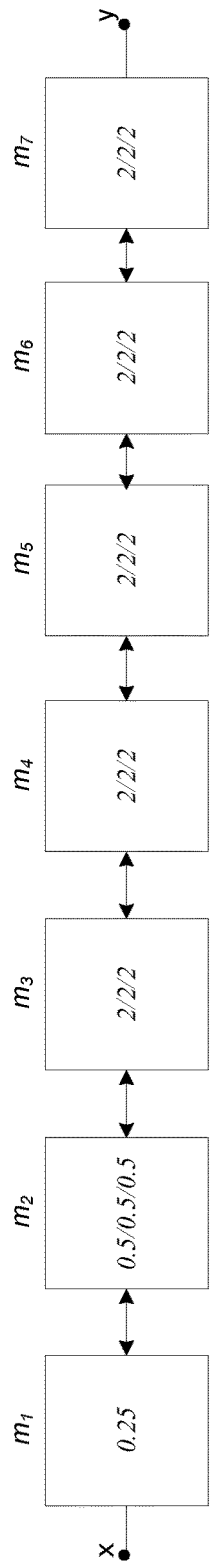
FIG. 4A illustrates an exemplary hybrid-coded step device in accordance with an embodiment of the invention.
Figure 4B:
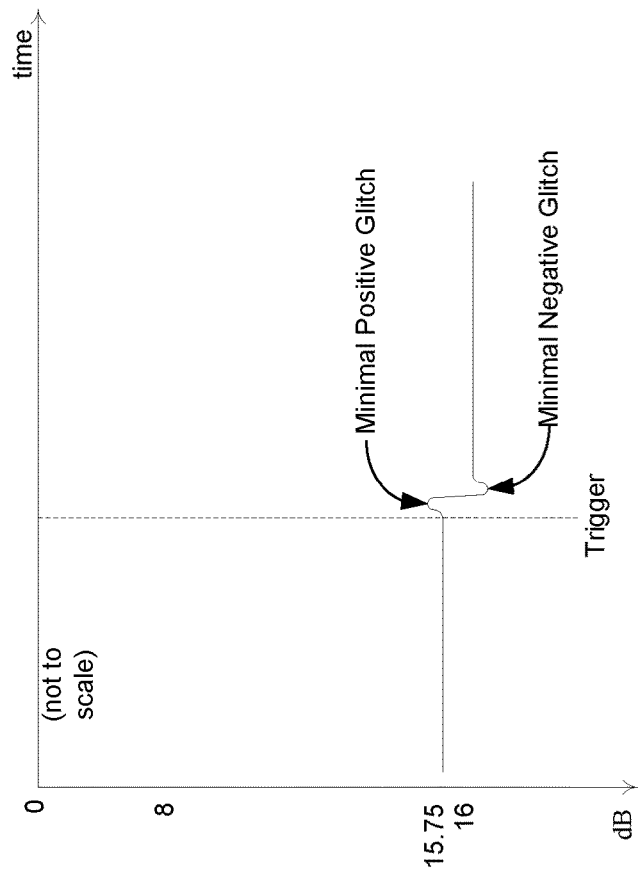
FIG. 4B illustrates an exemplary step response of a hybrid-coded step device in accordance with an embodiment of the invention.

For example, refer to FIGS. 2A, 2B, 3A, 3B, 4A and 4B. In comparison to the binary-coded step device illustrated in FIGS. 2A, 2B and the thermometer-coded step device illustrated in FIGS. 3A, 3B, FIG. 4A illustrates an exemplary hybrid-coded step device in accordance with an embodiment of the invention while FIG. 4B illustrates an exemplary step response of a hybrid-coded step device in accordance with an embodiment of the invention.

Assuming a range of 31.75 and a resolution of 0.25, in a binary coded step device shown in FIG. 2A, in cell m7 the largest selectable binary-coded step value is 16 while 0.25 would be the largest selectable thermometer-coded step value. At a range of 31.75, the ratio would be nearly 2:1 for a binary-coded step device and 127:1 for a thermometer-coded step device. The ratio for a hybrid-coded step device would be between these two ratios, greater than a ratio for a binary coded step device and less than a ratio for a thermometer-coded step device.

For example, in a hybrid-coded step device shown in FIG. 4A, a fixed cell m1 may step 0.25, a variable cell m2 may step from 0 to 1.5 in steps of 0.5 (i.e. a uniform cell resolution of 0.5 and a cell range of 1.5) while five other variable cells m3-m7 may step from 0 to 6 in increments of 2 (i.e. a uniform cell resolution of 2 and a cell range of 6), such that 2 is the largest selectable step value. Therefore, in one embodiment of a hybrid-coded step device having a range of 31.75 and a resolution of 0.25, a ratio of the range to the largest selectable step value would be 31.75:2 or nearly 16:1, which is greater than 2:1 in the binary-coded step device and smaller than 127:1 in the thermometer-coded step device.

A comparison of FIGS. 2B and 4B shows the advantage of smaller steps in hybrid-coded step devices relative to binary-coded step devices. Smaller steps result in less glitch headroom and, therefore, smaller glitches. For example, in the hybrid-coded step device shown in FIG. 4A, a level of 15.75 is provided by enabling cell m1, all three stages in cell m2, all three stages in cell m3, all three stages in cell m3, and one cell in cell m5 while all remaining stages and cells are disabled or bypassed. To step to level 16 from 15.75, the only changes in cell states for level 15.75 are that cell m1 is disabled, all three cells in cell m2 are disabled and a second stage in cell m5 is enabled, which means 1.75 is disabled while 2.0 is enabled. As a result of less glitch headroom, glitches are substantially reduced in hybrid-coded step devices, as shown in FIG. 4B by a minimal positive glitch and a minimal negative glitch in response to a trigger stepping from 15.75 to 16 in the hybrid-coded step device of FIG. 4A.

Not only are glitches less consequential in hybrid-coded step devices, but there may be also be fewer occurrences of glitches due to fewer occurrences of simultaneous on-off switching of step values compared to binary-coded step values. Although not graphically depicted, a clear advantage of having far fewer cells than a thermometer-coded step device is the avoidance or minimization of significant increases or degradation in one or more of area, package dimensions, pin counts, power consumption, insertion loss and parasitic capacitance. One or more cells may have a bypass to bypass or disable a cell. For example, a bypass may pass a signal through a cell without modification, although perhaps with some insertion loss. An advantage of variable cells is that a plurality of steps may share a single bypass, thereby reducing insertion loss by reducing the number of cells.

For variable cells, there are two perspectives to consider, intra-cell and inter-cell when considering architecture, coupling, coding, etc. within or between cells. Intra-cell stages, may be coupled in serial, parallel, a combination thereof or other configurations. Inter-cell coupling that externally couples cells may be serial, parallel, a combination thereof or other configurations.

Figure 5A:
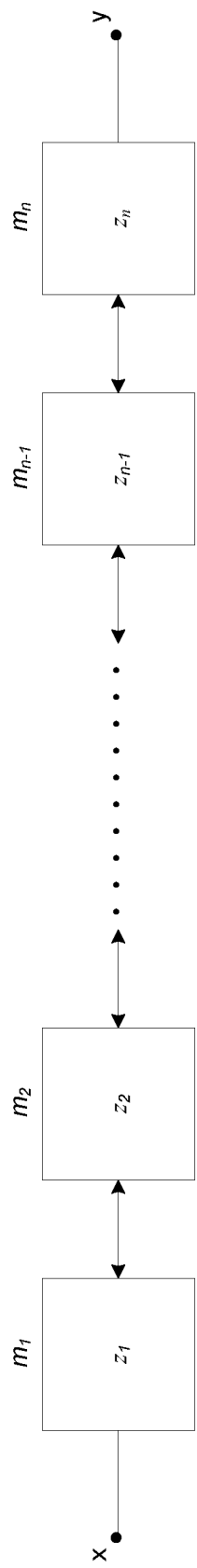
FIG. 5A illustrates series-coupled cells in a hybrid-coded step device in accordance with an embodiment of the invention.
Figure 5B:
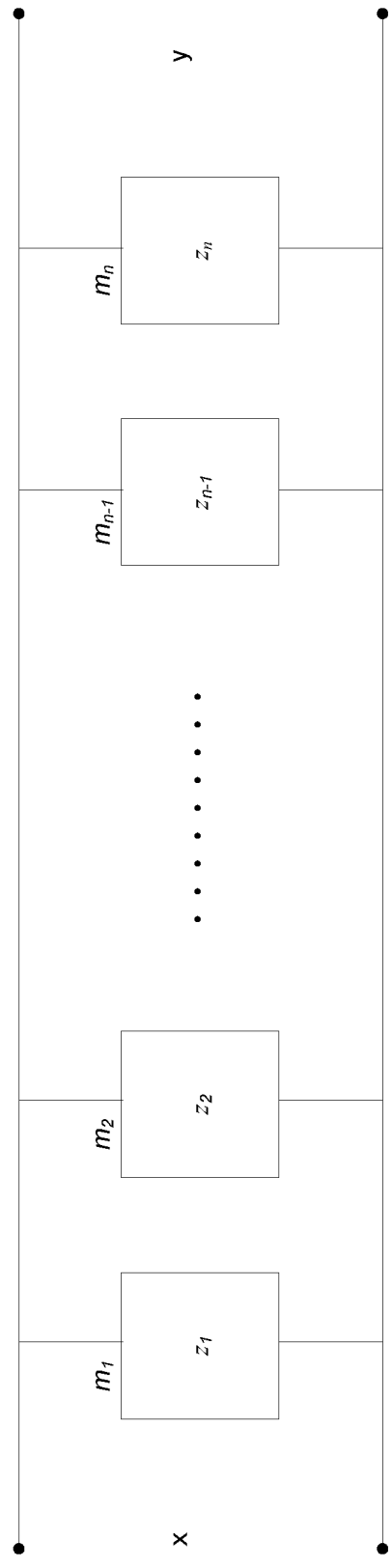
FIG. 5B illustrates parallel-coupled cells in a hybrid-coded step device in accordance with an embodiment of the invention.

FIG. 5A illustrates series-coupled cells in a hybrid-coded step device in accordance with an embodiment of the invention while FIG. 5B illustrates parallel-coupled cells in a hybrid-coded step device in accordance with an embodiment of the invention. FIGS. 5A and 5B are merely two of many possible inter-cell configurations, i.e., inter-cell architectures. These and other hybrid-coded device configurations divide a total parameter space or range of a step device into n subsets. As a result, first through n cells $m_1$-$m_n$ provide subsets of parameter space having subranges $z_1$-$z_n$. Cells may be fixed or variable with at least one cell being variable. Each variable cell comprises a plurality of stages or unit cells having unit or step values. The subrange z of each variable cell is determined by the number of unit cells and their unit/step values within the variable cell. Depending on the embodiment, stages or unit cells may be formed as physical combinations or may be selected in the alternative with physical separation between distinct unit cells or stages. Regardless of the cellular architecture, the plurality of cells serve to step one or more parameters between nodes x and y. While the parameter presented in most examples herein is attenuation in units of dB, the parameter and units in other embodiments may be different. Hybrid-coded step devices may implement any parameter(s), including but not limited to attenuation, impedance, resistance, capacitance and inductance in appropriate units.

Intra-cell and inter-cell coding may depend on the architecture of cells and step devices in various embodiments. Intra-cell coding in variable cells in a step device may be the same or different from variable cell to variable cell. Some variable cells may be thermometer-coded while others may be binary-coded while still others may have other coding. Inter-cell coding of cells in a step device may be the same or different compared to intra-cell coding of variable cells. A control code may be decoded, e.g., using a map or table, to translate a compact code to control selection of fixed and variable cells according to a desired state of the step device.

In the example in FIG. 4A where a first fixed cell m1 has a step value of 0.25, a second variable cell m2 steps from 0 to 1.5 in steps of 0.5 and five remaining variable cells m3-m7 step from 0 to 6 in steps of 2, this step device may be programmed to provide a range of 31.75 with uniform step resolution of 0.25 or a different combination of range and resolution such as 0.5, 1, 2, etc. Considering the example with a resolution of 0.25, intra-cell coding of cell m2 may be thermometer coding since each time the second cell is used during a consecutive step, e.g., stepping from 0.25 to 0.5 to 0.75 to 1.0 to 1.25 to 1.5 to 1.75, each of its three stages are turned on and remain on and vice versa. Intra-cell coding of cells m3-m7 would also be thermometer coding counting in a variety of increments because stages are activated and remain activated. Cells m3-m7 could also have thermometer intra-cell coding. However, since the first and second cells are alternately turned on and off during a consecutive step from 0 to 31.75, inter-cell coding of step device is not thermometer. It also is not binary, although it may be considered binary skipping some counts.

Consider the example where the step device in FIG. 4A is programmed to step in steps of 2, which means cells m1 and m2 will be disabled, e.g., bypassed. In this programming example, both intra-cell and inter-cell programming is thermometer code because as each stage and cell is enabled it remains enabled during stepping. However, compared to traditional thermometer-coding as shown in FIG. 3A, multi-cells accomplish thermometer coding with fewer cells, less area, less insertion loss, etc.

Although, as indicated with different programming examples, the step device may be programmed in various ways as hybrid-coded, thermometer-coded, binary-coded, etc., even if it is uni-coded with strictly thermometer or binary coding for a particular implementation, the multi-cell step device illustrated in FIG. 4A remains hybrid-codable to combine multi-cells with hybrid-coding.

In some embodiments, direct control of cells may be implemented with control codes. In other embodiments, compact control codes and decoding may be used to generate inter-cell and intra-cell control codes. Direct or indirect control may be implemented in many ways. For example, logic may be incorporated into cells and/or into a step device external to cells, e.g., intra-cell logic and/or inter-cell logic. Decoding may be implemented in many ways, e.g., intra-cell logic and/or inter-cell logic implemented in analog or digital hardware or a combination of hardware and software, such as gates, multiplexer, translation table or map, etc. In the foregoing example comprising 128 states, a compact 7-bit control code defining the state of the step device illustrated in FIG. 4A could be decoded into a larger number of bits for control lines to control the state of each cell for each state of the device. In this example, there are two states in the first cell m1 and four states in cells two thru seven m2-m7, the four states being 0, 0.5, 1.0, 1.5 in cell m2 and 0, 2, 4, 6 in cells m3-m7. Each device state may be associated with a set of cell states and signals that would cause the enablement and disablement of different components in the cells to generate the selected state for each cell. A cell having four states may be represented by two bits or a cell having three stages may have at least one bit per stage. Each selectable cell and step within a cell may be implemented by any selectable technique. In some embodiments, each cell or step within a cell may be implemented as one or more selectable transistor (e.g. FET) switches that enable and disable or couple and decouple components in a cell, whether the cell is a single or a multi-cell, in accordance with the desired cell state. The components, e.g., resistors, may be fixed or variable.

Figure 6A:
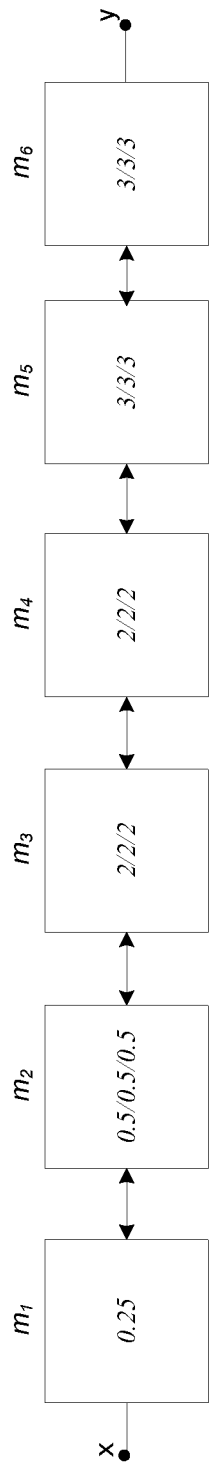
FIGS. 6A and 6B illustrate exemplary cell configurations in a hybrid-coded step device in accordance with an embodiment of the invention.
Figure 6B:
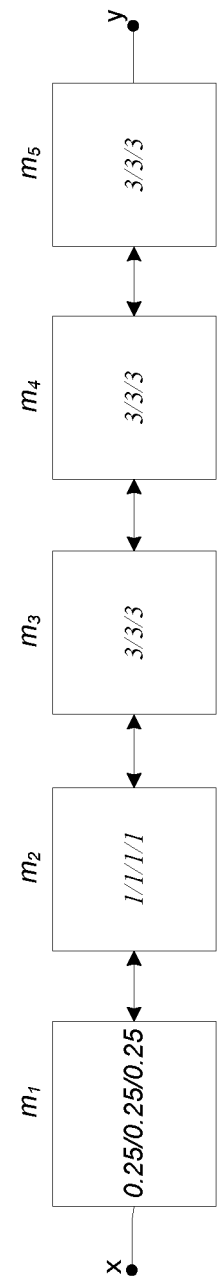

Additional examples of cell configurations are provided in FIGS. 6A-B, 7A-C and 8A-C. The examples presented in these and other figures are only a few of many possible embodiments with a variety of architectures, ranges, resolutions, number of cells, cell stages, step values, etc. FIGS. 6A and 6B illustrate, in addition to FIG. 4A, exemplary 7-bit (up to 128 state) architecture cell configurations in a hybrid-coded step device in accordance with an embodiment of the invention.

The embodiment illustrated in FIG. 6A comprises a first fixed cell m1 with a step value of 0.25, a second variable cell m2 that steps from 0 to 1.5 in steps of 0.5, third and fourth cells m3, m4 that step from 0 to 6 in steps of 2 and fifth and sixth cells m5, m6 that step from 0 to 9 in steps of 3. Like the step device in FIG. 4A, this step device may be programmed to provide a range of 31.75 with uniform step resolution of 0.25 or a different combination of range and resolution. This embodiment differs from the embodiment in FIG. 4A by having one less cell. Where the embodiment in FIG. 4A had three cells each with a range of 6, this embodiment has two cells each with a range of 9. This embodiment may result in more glitch situations due to more occurrences of simultaneous on/off and slightly larger glitches than the embodiment in FIG. 4A. Its ratio of range to maximum step value is 31.75:3, which is approximately 10:1.

The embodiment illustrated in FIG. 6B comprises a first variable cell m1 that steps from 0 to 0.75 in steps of 0.25, a second variable cell m2 that steps from 0 to 4 in steps of 1 and third through fifth cells m3-m5 that step from 0 to 9 in steps of 3. Like the step device in FIG. 4A, this step device may be programmed to provide a range of 31.75 with uniform step resolution of 0.25 or a different combination of range and resolution. This embodiment differs from the embodiment in FIG. 4A by having two fewer cells and by every cell being variable with different step values than in FIG. 4A. This embodiment may result in more glitch situations due to more occurrences of simultaneous on/off switching of cells and slightly larger glitches than the embodiment in FIG. 4A. Its ratio of range to maximum step value is 31.75:3, which is approximately 10:1.

Figure 7A:
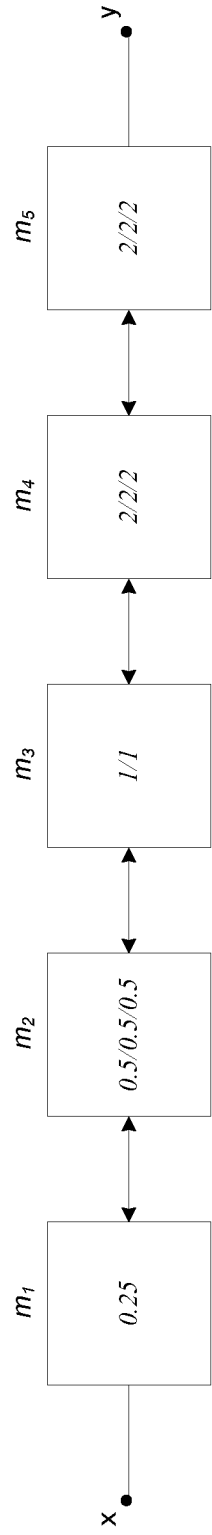
FIGS. 7A, 7B and 7C illustrate exemplary cell configurations in a hybrid-coded step device in accordance with an embodiment of the invention.
Figure 7B:
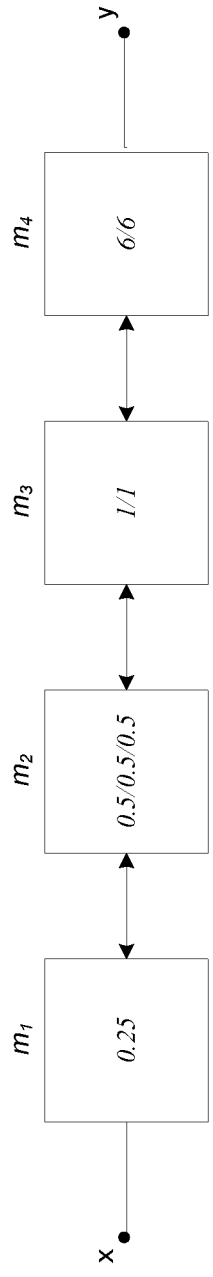
Figure 7C:
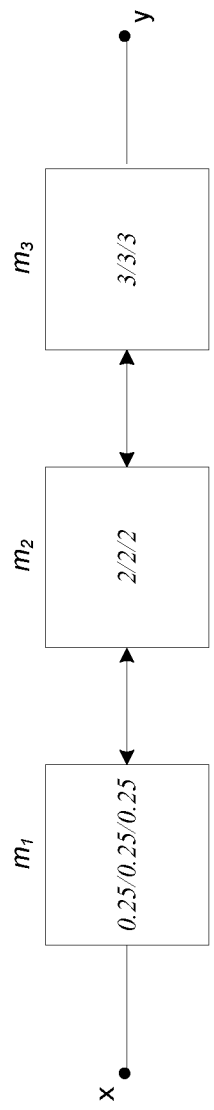

FIGS. 7A, 7B and 7C illustrate exemplary 6-bit (up to 64 state) architecture cell configurations in a hybrid-coded step device in accordance with an embodiment of the invention. The embodiment illustrated in FIG. 7A comprises a first fixed cell m1 that steps from 0 to 0.25, a second variable cell m2 that steps from 0 to 1.5 in steps of 0.5, third variable cell m3 that steps from 0 to 2 in steps of 1 and fourth and fifth cells m4, m5 that step from 0 to 6 in steps of 2. This step device may be programmed to provide a range of 15.75 with uniform step resolution of 0.25 or a different combination of range and resolution. This embodiment is similar to the embodiment in FIG. 4A, except its range is 15.75 instead of 31.75. The ratio of range to maximum step value is 15.75:2, which is approximately 8:1. In comparison, the ratio for a binary-coded step device with the same range and resolution would be 15.75:8 or approximately 2:1 while the ratio for a thermometer coded step device with the same range and resolution would be 15.75:0.25 or 63:1.

The embodiment illustrated in FIG. 7B comprises a first fixed cell m1 that steps from 0 to 0.25, a second variable cell m2 that steps from 0 to 1.5 in steps of 0.5, third variable cell m3 that steps from 0 to 2 in steps of 1 and fourth variable cell m4 that steps from 0 to 12 in steps of 6. Like the step device in FIG. 7A, this step device may be programmed to provide a range of 15.75 with uniform step resolution of 0.25 or a different combination of range and resolution. This embodiment differs from the embodiment in FIG. 7A by having one less cell. Where the embodiment in FIG. 7A had two cells each with a range of 6, this embodiment has one cell with a range of 12. This embodiment may result in more glitch situations due to more occurrences of simultaneous on/off switching and larger glitches than the embodiment in FIG. 7A. Its ratio of range to maximum step value is 15.75:6, which is approximately 2.6:1.

The embodiment illustrated in FIG. 7C comprises first variable cell m1 that steps from 0 to 0.75 in steps of 0.25, a second variable cell m2 that steps from 0 to 6 in steps of 2 and third variable cell m3 that steps from 0 to 9 in steps of 3. Like the step device in FIG. 7A, this step device may be programmed to provide a range of 15.75 with uniform step resolution of 0.25 or a different combination of range and resolution. This embodiment differs from the embodiment in FIG. 7A by having two fewer cells and cells with different step values. This embodiment may result in more glitch situations due to more occurrences of simultaneous on/off switching and slightly larger glitches than the embodiment in FIG. 7A. Its ratio of range to maximum step value is 15.75:3, which is 5.25:1.

Figure 8A:
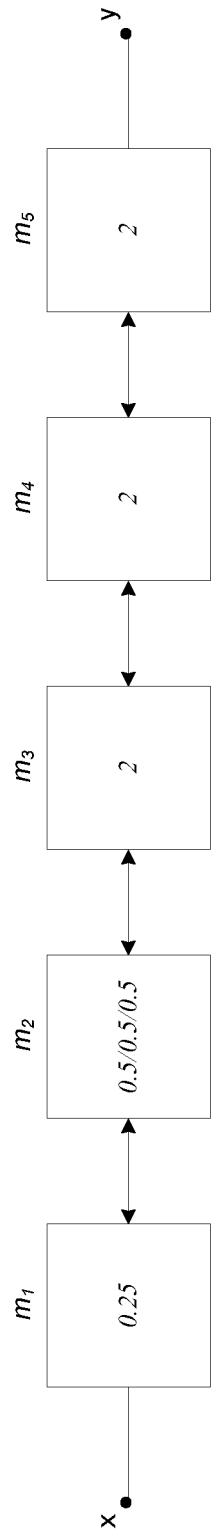
FIGS. 8A, 8B and 8C illustrate exemplary cell configurations in a hybrid-coded step device in accordance with an embodiment of the invention.
Figure 8B:
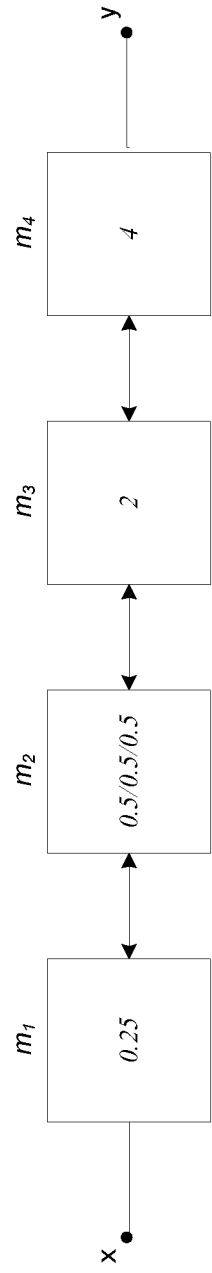
Figure 8C:
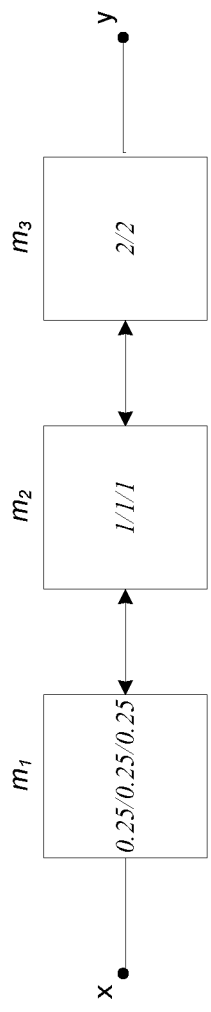

FIGS. 8A, 8B and 8C illustrate exemplary 5-bit (up to 32 state) architecture cell configurations in a hybrid-coded step device in accordance with an embodiment of the invention. The embodiment illustrated in FIG. 8A comprises a first fixed cell m1 that steps from 0 to 0.25, a second variable cell m2 that steps from 0 to 1.5 in steps of 0.5 and third through fifth fixed cells m3-m5 that step from 0 to 1. This step device may be programmed to provide a range of 7.75 with uniform step resolution of 0.25 or a different combination of range and resolution. The ratio of range to maximum step value is 7.75:2, which is approximately 4:1. In comparison, the ratio for a binary-coded step device with the same range and resolution would be 7.75:4 or approximately 2:1 while the ratio for a thermometer coded step device with the same range and resolution would be 7.75:0.25 or 31:1.

The embodiment illustrated in FIG. 7B comprises a first fixed cell m1 that steps from 0 to 0.25, a second variable cell m2 that steps from 0 to 1.5 in steps of 0.5, third fixed cell m3 that steps from 0 to 2 and fourth fixed cell m4 that steps from 0 to 4. Like the step device in FIG. 7A, this step device may be programmed to provide a range of 7.75 with uniform step resolution of 0.25 or a different combination of range and resolution. This embodiment differs from the embodiment in FIG. 8A by having one less cell. Where the embodiment in FIG. 8A had two cells each with a range of 2, this embodiment has one cell with a range of 4. This embodiment may result in more glitch situations due to more occurrences of simultaneous on/off switching and larger glitches than the embodiment in FIG. 8A. Its ratio of range to maximum step value is 7.75:4, which is approximately 2:1. This ratio is the same as a binary-coded step device with the same range and resolution. However, the difference is that the multi-cell m2 reduces the number of cells and insertion loss.

The embodiment illustrated in FIG. 8C comprises first variable cell m1 that steps from 0 to 0.75 in steps of 0.25, a second variable cell m2 that steps from 0 to 3 in steps of 1 and third variable cell m3 that steps from 0 to 4 in steps of 2. Like the step device in FIG. 8A, this step device may be programmed to provide a range of 7.75 with uniform step resolution of 0.25 or a different combination of range and resolution. This embodiment differs from the embodiment in FIG. 8A by having two fewer cells and cells with different step values. Its ratio of range to maximum step value is 7.75:2, which is 4:1 in only three cells compared to five cells in a binary-coded step device with the same range and resolution and 31 cells in a thermometer-coded step device with the same range and resolution.

Figure 9:
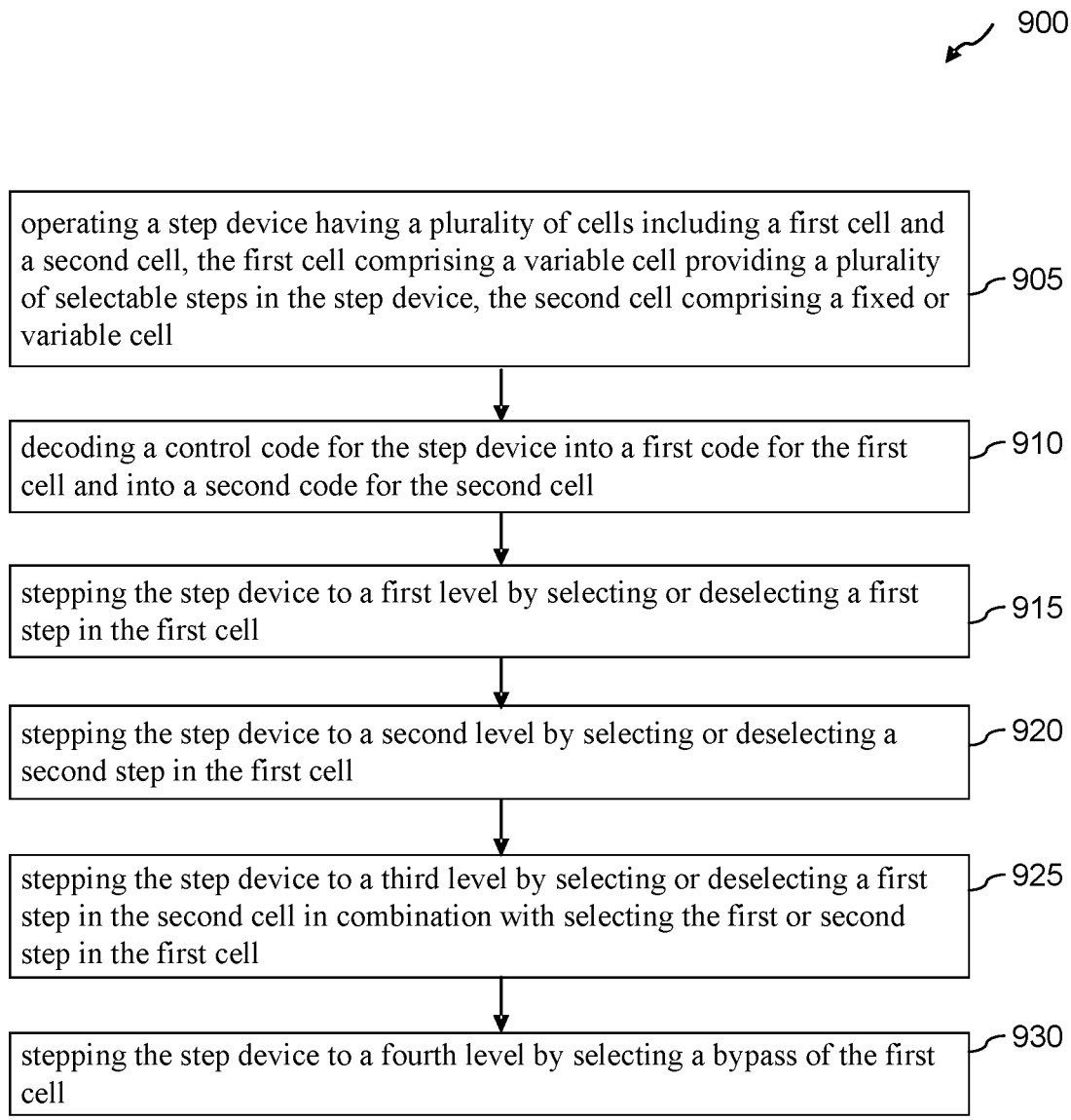
FIG. 9 illustrates an exemplary method in accordance with an embodiment of the invention.

Embodiments of the invention may be implemented as methods. One such method is illustrated in FIG. 9. FIG. 9 illustrates an exemplary method in accordance with an embodiment of the invention. No order of steps is required unless expressly indicated or inherently required. There is no requirement that a method embodiment implement all of the steps illustrated in FIG. 9. FIG. 9 is simply one of many possible embodiments. Embodiments may implement fewer, more or different steps. Method 900 in accordance with an embodiment of the invention comprises step 905, operating a step device having a plurality of cells including a first cell and a second cell, the first cell comprising a variable cell providing a plurality of selectable steps in the step device, the second cell comprising a fixed or variable cell. Of course a step device may comprise any number of cells of any variety, fixed or variable. Cells may be variable or a hybrid of variable and fixed cells. The step device may be hybrid coded.

Method 900 further comprises step 910, decoding a control code for the step device into a first code for the first cell and into a second code for the second cell. Inter-cell and intra-cell codes may be decoded from a control code. Intra-cell coding of the first cell may be the same or different than an intra-cell coding of the second cell. For example, some method embodiments may comprise applying a first code (e.g. thermometer code) to select steps in the first cell and applying a second code (e.g. binary or other code) to select steps in the second cell.

Method 900 further comprises step 915, stepping the step device to a first level by selecting or deselecting a first step in the first cell. For example, a step device may be stepped to a first level by selecting or deselecting any stage in any one of the variable cells illustrated in any one of FIG. 4A, 6A-B, 7A-C or 8A-C.

Method 900 further comprises step 920, stepping the step device to a second level by selecting or deselecting a second step in the first cell. For example, a step device may be stepped to a second level by selecting or deselecting any stage in any one of the variable cells illustrated in any one of FIG. 4A, 6A-B, 7A-C or 8A-C so long as it is the same variable cell selected to step to the first level. This demonstrates the operation of multi-cells.

Method 900 further comprises step 925, stepping the step device to a third level by selecting or deselecting a first step in the second cell in combination with selecting the first or second step in the first cell. For example, a step device may be stepped to a third level by selecting or deselecting any stage in any one of the fixed or variable cells illustrated in any one of FIG. 4A, 6A-B, 7A-C or 8A-C so long as it is the same step device and is a different cell than the cell selected to step to the first and second levels. This demonstrates the operation of step devices comprising a plurality of cells, including at least one multi-cell.

Method 900 further comprises step 930, stepping the step device to a fourth level by selecting a bypass of the first cell. For example, a step device may be stepped to a fourth level by deselecting any one of the variable cells illustrated in any one of FIG. 4A, 6A-B, 7A-C or 8A-C so long as it is the same variable cell selected to step to the first and second levels. This demonstrates the operation of multi-cells where a plurality of stages share a common bypass.

Step devices comprising variable step cells, i.e., multi-step value cells or multi-cells, as well as the multi-cells and steps within a cell, may be implemented by any controllable or selectable technique. Embodiments are applicable to both single-ended and differential circuits. In some embodiments, each cell or step within a cell may be implemented as one or more selectable transistor switches that enable and disable or couple and decouple components in a cell, whether the cell is a single or a multi-cell, in accordance with a desired cell state. The components, e.g., resistors, may be fixed or variable. Several examples of multi-cells will now be provided. The examples in FIGS. 10-14 are multi-cell attenuators. However, multi-cells operate with all parameter(s).

Figure 10:
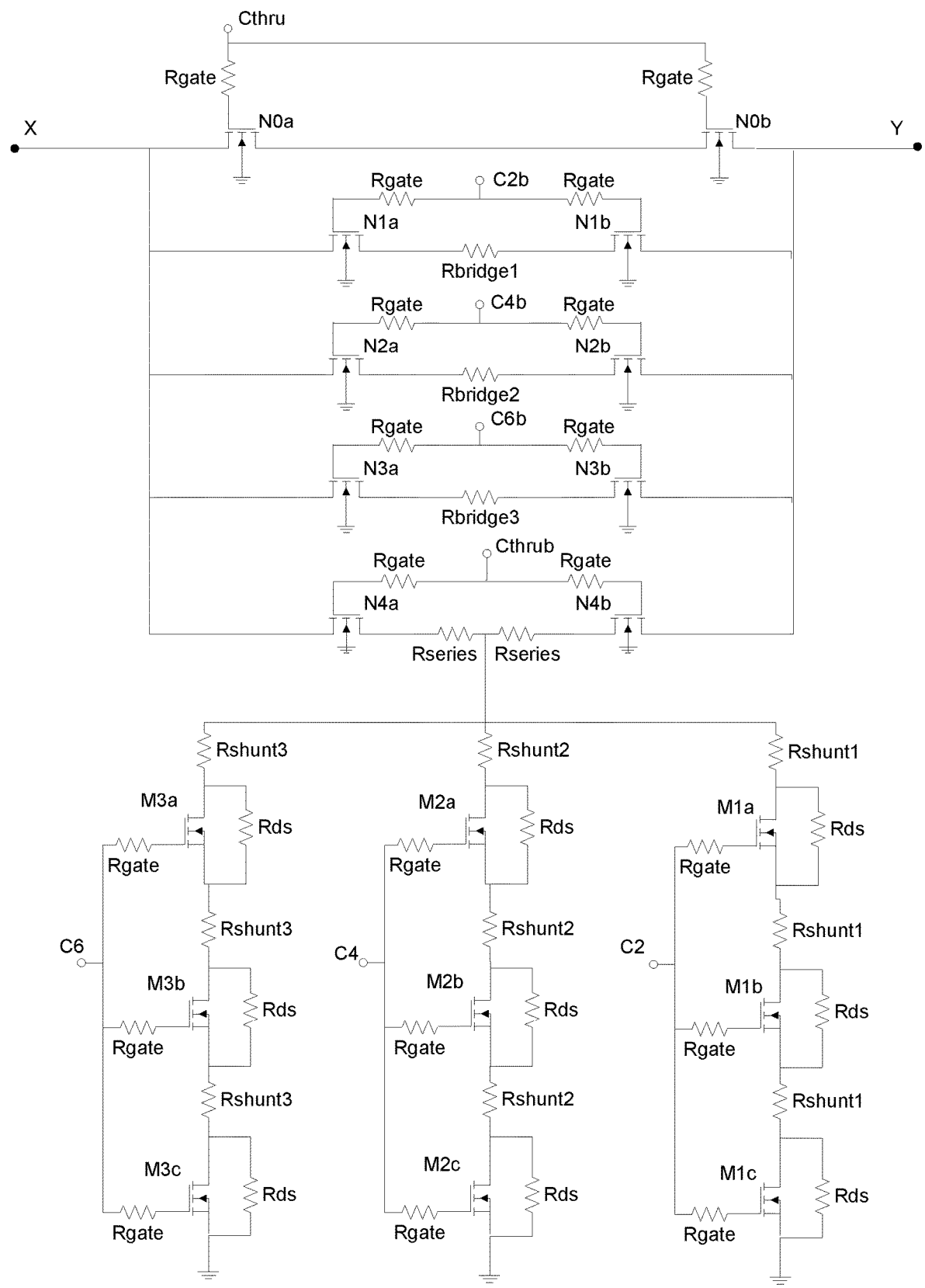
FIG. 10 illustrates an exemplary bridged tee attenuator implementation of a variable cell in a step attenuator in accordance with an embodiment of the invention.

FIG. 10 illustrates an exemplary bridged tee attenuator implementation of a variable cell in a step attenuator in accordance with an embodiment of the invention. Moving from top to bottom, this multi-cell bridged tee attenuator embodiment comprises one bypass arm, three bridge arms, one series arm and three shunt arms. Other embodiments of variable or multi-cells may have more or fewer arms. In one embodiment, the bridged tee attenuator is operated by four control signals, Cthru, C2, C4 and C6, as well as the inverse of each of these signals, Cthrub, C2b, C4b and C6b. Signal input may, for example, be coupled to node x and signal output may be coupled to node y. For example, an RF signal may be input at node x and output at node y, subjected to varying levels of attenuation.

The bypass arm comprises two bypass transistors N0a and N0b and two gate resistors Rgate. The two bypass transistors N0a and N0b are coupled in series between nodes x and y. Bypass control signal Cthru operates bypass transistors N0a and N0b through gate resistors Rgate. The presence of two bypass transistors illustrates that the bypass arm may be configured to handle a higher signal power or a higher signal level than may be possible with one bypass transistor. Stacking transistors in the bypass arm is one technique to permit greater signal level and power handling capability in the multi-cell bridged tee attenuator. More or fewer components may be used in other embodiments. As previously noted, the power handling capability of cells in a step device may vary between cells, e.g., depending on the order in which cells are coupled to a signal.

The three bridge arms are coupled in parallel between nodes x and y. The first bridge arm comprises first bridge resistor Rbridge1, two first bridge transistors N1a, N1b and two gate resistors Rgate. First bridge transistor N1a, first bridge resistor Rbridge1 and first bridge transistor N1b are coupled in series between nodes x and y. Control signal C2b operates first bridge transistors N1a, N1b thru gate resistors Rgate.

The second bridge arm comprises second bridge resistor Rbridge2, two second bridge transistors N2a, N2b and two gate resistors Rgate. Second bridge transistor N2a, second bridge resistor Rbridge2 and second bridge transistor N2b are coupled in series between nodes x and y. Control signal C4b operates second bridge transistors N2a, N2b thru gate resistors Rgate.

The third bridge arm comprises third bridge resistor Rbridge3, two third bridge transistors N3a, N3b and two gate resistors Rgate. Third bridge transistor N3a, first bridge resistor Rbridge1 and third bridge transistor N3b are coupled in series between nodes x and y. Control signal C6b operates third bridge transistors N3a, N3b thru gate resistors Rgate.

The series arm comprises two series resistors Rseries, two series transistors N4a, N4b and two gate resistors Rgate. Series transistor N4a, both series resistors Rseries and series transistor N4b are coupled in series between nodes x and y. Control signal Cthrub operates series transistors N4a, N4b thru gate resistors Rgate.

The three shunt arms are coupled in parallel between the two series resistors Rseries and ground. The first shunt arm comprises three first shunt resistors Rshunt1, three first shunt transistors M1a, M1b, M1c, three gate resistors Rgate and three drain-source resistors Rds. The three first shunt resistors Rshunt1 and the three first shunt transistors M1a, M1b, M1c are alternately coupled in series between the two series resistors Rseries and ground. Each drain-source resistor Rds is coupled across a respective one of first shunt transistors M1a, M1b, M1c. Control signal C2 operates first shunt transistors M1a, M1b, M1c through gate resistors Rgate. The presence of two three shunt transistors and three shunt resistors illustrates that the shunt arm(s) may be configured to handle a higher signal power or a higher signal level than may be possible with one shunt transistor and one shunt resistor. Stacking transistors in the shunt arm(s) is one technique to permit greater signal level and power handling capability in the multi-cell bridged tee attenuator. More or fewer components may be used in other embodiments.

The second shunt arm comprises three second shunt resistors Rshunt2, three second shunt transistors M2a, M2b, M2c, three gate resistors Rgate and three drain-source resistors Rds. The three second shunt resistors Rshunt2 and the three second shunt transistors M2a, M2b, M2c are alternately coupled in series between the two series resistors Rseries and ground. Each drain-source resistor Rds is coupled across a respective one of second shunt transistors M2a, M2b, M2c. Control signal C4 operates second shunt transistors M2a, M2b, M2c through gate resistors Rgate. Like the first shunt arm, the second shunt arm stacks three transistors and three shunt resistors for greater signal level and power handling capability. More or fewer components may be used in other embodiments.

The third shunt arm comprises three third shunt resistors Rshunt3, three third shunt transistors M2a, M2b, M2c, three gate resistors Rgate and three drain-source resistors Rds. The three third shunt resistors Rshunt3 and the three third shunt transistors M3a, M3b, M3c are alternately coupled in series between the two series resistors Rseries and ground. Each drain-source resistor Rds is coupled across a respective one of third shunt transistors M3a, M3b, M3c. Control signal C6 operates third shunt transistors M3a, M3b, M3c through gate resistors Rgate. Like the first shunt arm, the third shunt arm stacks three transistors and three shunt resistors for greater signal level and power handling capability. More or fewer components may be used in other embodiments.

Regarding the operation of the step attenuator in FIG. 10, it has four states controlled by four bits, although logic could be added to operate the four states with fewer bits, e.g., two bits. As one example, consider the step attenuator to be an implementation of variable cell m3 in FIG. 4a having states 0 dB, 2 dB, 4 dB, 6 dB. The values of components in the step attenuator may vary between embodiments. However, in one embodiment, the value of gate resistors Rgate may be 100 kΩ, the value of drain-source resistors Rds may be 50 kΩ, the value of first bridge resistor Rbridge1 may be 22Ω, the value of second bridge resistor Rbridge2 may be 66Ω, the value of third bridge resistor Rbridge3 may be 66Ω, the value of series resistor Rseries may be 50Ω, the value of first shunt resistor Rshunt1 may be 59Ω, the value of second shunt resistor Rshunt2 may be 44Ω, and the value of third shunt resistor Rshunt3 may be 36Ω.

To activate the 0 dB state, the bypass arm is turned ON by bypass control signal Cthru turning both bypass transistors N0a, N0b ON, which means control signal Cthrub turns the series arm OFF by turning series transistors N4a, N4b OFF. Shunt control signals C2, C4, C6 turn each of the three shunt arms OFF, which causes control signals C2b, C4b and C6b to turn the three bridge arms ON. In some embodiments, having the bridge arms ON in the bypass mode or state provides increased power or signal level handling capability.

To activate the 2 dB state, the bypass arm is turned OFF by bypass control signal Cthru turning both bypass transistors N0a, N0b OFF, which means control signal Cthrub turns the series arm on by turning series transistors N4a, N4b ON. The first shunt arm is turned ON by control signal C2 turning first shunt transistors M1a, M1b, M1c ON, which means control signal C2b turns the first bridge arm OFF. Control signals C4 and C6 respectively turn the second and third shunt arms OFF, which causes control signals C4b and C6b to respectively turn the second and third bridge arms ON.

To activate the 4 dB state, the bypass arm is turned OFF by bypass control signal Cthru turning both bypass transistors N0a, N0b OFF, which means control signal Cthrub turns the series arm on by turning series transistors N4a, N4b ON.

The second shunt arm is turned ON by control signal C4 turning second shunt transistors M2a, M2b, M2c ON, which means control signal C4b turns the second bridge arm OFF. Control signals C2 and C6 respectively turn the first and third shunt arms OFF, which causes control signals C2b and C6b to respectively turn the first and third bridge arms ON.

To activate the 6 dB state, the bypass arm is turned OFF by bypass control signal Cthru turning both bypass transistors N0a, N0b OFF, which means control signal Cthrub turns the series arm on by turning series transistors N4a, N4b ON. The third shunt arm is turned ON by control signal C6 turning third shunt transistors M3a, M3b, M3c ON, which means control signal C6b turns the third bridge arm OFF. Control signals C2 and C4 respectively turn the first and second shunt arms OFF, which causes control signals C2b and C4b to respectively turn the first and second bridge arms ON.

In many possible embodiments, components, component values, configurations and control signals for each arm may be designed to select arms in the alternative, in combination or a mixture of alternative and combination. The value of components and the signals discussed in this embodiment, i.e., Cthru, C2, C4 and C6, Cthrub, C2b, C4b and C6b, may be designed and operated quite differently than described above. For example, in some embodiments, bridge arms may all be selected and only one shunt arm may be selected to provide the first attenuation state. For increasing levels of attenuation, fewer bridge arms and more shunt arms may be selected. In such an embodiment, the bypass state may be selected by turning ON the bypass arm and all bridge arms, the 2 dB state may be selected by turning ON all bridge arms and only the first shunt arm with all other arms OFF, the 4 dB state may be selected by turning ON the second and third bridge arms and the first and second shunt arms with all other arms OFF, the 6 dB state may be selected by turning ON only the third bridge arm and the first, second and third shunt arms with all other arms OFF. In another embodiment only one bridge arm and only one shunt arm are selected with all other arms OFF to provide each attenuation state. Operation simply depends on architecture, component values and desired operation.

Step attenuator devices in accordance with an embodiment of the invention may comprise one or more multi-cell attenuators, such as the multi-cell attenuator illustrated in FIG. 10. Of course each cell in a step attenuator is selectable to provide one or more cell attenuation levels. A multi-cell attenuator in accordance with an embodiment of the invention may comprise, for example, a plurality of first attenuation arms between node set A and a plurality of second attenuation arms between node set B, where node set A and node set B are different. With reference to the multi-cell attenuator in FIG. 10, for example, node set A may comprise nodes x and y while node set b may comprise the node between the series resistors Rseries and the ground node. The three bridge arms (e.g. the plurality of first attenuation arms) are between node set A and the three shunt arms (e.g. the plurality of second attenuation arms) are between node set B. Node sets A and B are different.

Each of the plurality of first attenuation arms (e.g. the three series arms) and each of the plurality of second attenuation arms (e.g. the three shunt arms) are selectable to enable or disable them. A plurality of attenuation levels (e.g. 0 dB, 2 dB, 4 dB, 6 dB) may be provided by the multi-cell attenuator by selecting a plurality of different combinations comprising at least one of the plurality of first attenuation arms and at least one of the plurality of second attenuation arms (e.g. first shunt arm with second and third bridge arms, second shunt arm with first and third bridge arms, third shunt arm with first and second bridge arms). Arms may be selected in combination, alternatively or a combination thereof to provide selected step values. Each of the plurality of combinations of arms that provide an attenuation level are referenced as a unit cell or stage regardless whether there is a logical or physical division of components between each attenuation level.

Each set of selectable attenuation arms may be configured in serial, in parallel or a combination thereof between a node set. For example, in some embodiments, a plurality of first attenuation arms may be configured in parallel between node set A and the plurality of second attenuation arms may be configured in parallel between node set B. In some embodiments, the plurality of first attenuation arms may comprise a plurality of series arms and the plurality of second attenuation arms may comprise a plurality of shunt arms in a variable tee, bridged tee or pi attenuator. In some embodiments, such as the embodiment shown in FIG. 10, the plurality of first attenuation arms may comprise a plurality of bridge arms and the plurality of second attenuation arms may comprise a plurality of shunt arms in a variable bridged tee attenuator. In some of many possible embodiments, there may be more than two sets of attenuation arms.

For example, in a pi attenuator configuration having three arms and three sets of nodes, a pi attenuator may comprise three sets of selectable attenuation arms. In some embodiments, one or more cells, whether single or multi-cells, in a step attenuator may comprise a bypass attenuation arm. A bypass arm may be selected to bypass attenuation in a particular cell. A bypass arm common to a plurality of unit cells or stages is illustrated in the embodiment of FIG. 10. An advantage of multi-cells is that a plurality of cells or attenuation steps share a bypass arm, which limits insertion loss. The embodiment in FIG. 10 shows only one of many possible multi-cell configurations. In other embodiments, selectable attenuation arms may be selected in any combination to step attenuation levels. For example, in some embodiments, an attenuation level is stepped by decreasingly combining arms in the plurality of the first attenuation arms and increasingly combining arms in the plurality of second attenuation arms or vice versa depending on the direction of the step.

Some cells may be configured to handle higher signal or power levels than other cells. For example, in a step attenuator comprising a plurality of cells where a first cell is configured to receive a signal before a second cell, the first cell may be configured to handle a higher signal power or a higher signal level than the second cell. In some embodiments, this may be accomplished by stacking transistors in one or more of the first attenuation arm, the second attenuation arm, the bypass attenuation arm or other arm of an attenuation cell, whether single or multi-cell. The embodiment in FIG. 10 illustrates stacking on the three bridge arms and the bypass arm. In other embodiments, none, some or all arms may implement stacking.

As with any step device embodiment, step attenuator device embodiments may comprise a plurality of cells, which may be multi-cells or a combination of single and multi-cells. Each attenuation step between each of the plurality of multi-cell attenuation levels may be the same or different. In the embodiment in FIG. 10, each attenuation step may be the same (i.e. a fixed resolution) or different. Components may be adjusted as necessary for particular embodiments.

Intra-cell coding of a multi-cell may be the same or different compared to intra-cell coding of another multi-cell.

Intra-cell coding of a multi-cell may be the same or different compared to inter-cell coding of a step attenuator. Intra-cell coding in the embodiment in FIG. 10, given a multi-cell having a range of 6 and a resolution of 2, may be thermometer coding or other coding. It depends on the range, resolution, combination of cells, etc. to determine cell coding from one embodiment to the next.

Cell resolution, range and step values for each multi-cell, and therefore for the step device, may be fixed or may be statically or dynamically variable, e.g., through the use of variable components for calibration or programming. For example, variable resistors may be deployed in one or more arms or in other components of a multi-cell for programming or calibration.

Each selectable step may be implemented by any technique. In some embodiments, such as the embodiment illustrated in FIG. 10, each attenuation arm may be implemented as one or more transistor switches selectable by at least one control signal that couple and decouple components in a cell, whether single or multi-cell. Although FIG. 10 and other figures illustrate transistors, other selection techniques may be implemented in other embodiments. Although embodiments herein illustrate FETs, in other embodiments other transistor technologies may be used. For example, in other embodiments, transistors may be a bipolar device, e.g., BJT or heterojunction bipolar transistor (HBT), metal semiconductor field effect transistor (MESFET) device or other transconductor or transistor technology device. Such alternative devices may require alternative configurations other than the configuration illustrated in the figures. The components, e.g., resistors, may be fixed or variable. FIG. 10 illustrates an embodiment with fixed resistors.

Figure 11:
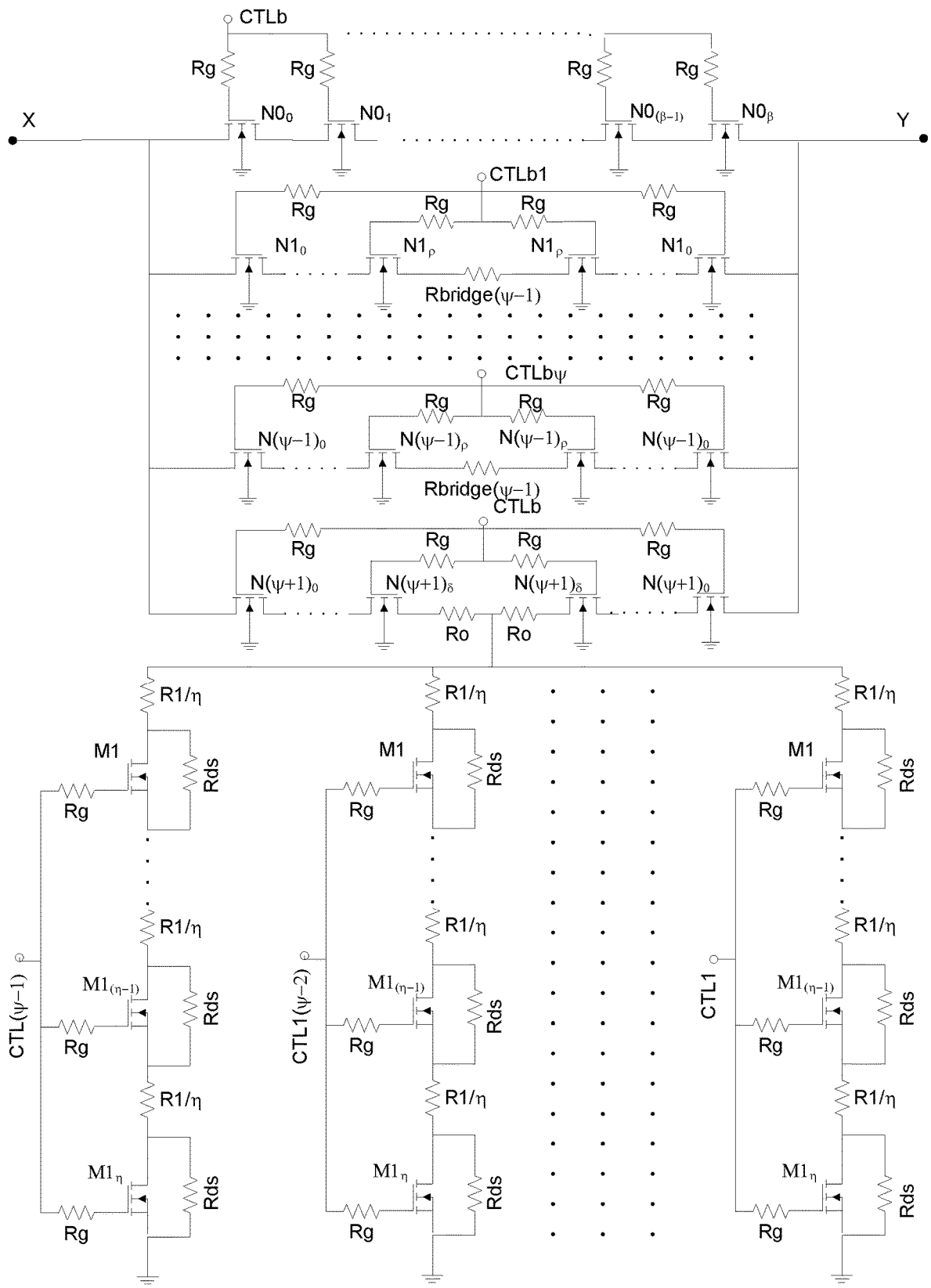
FIG. 11 illustrates an exemplary expandable bridged tee attenuator implementation of a variable cell in a step attenuator in accordance with an embodiment of the invention.
Figure 12:
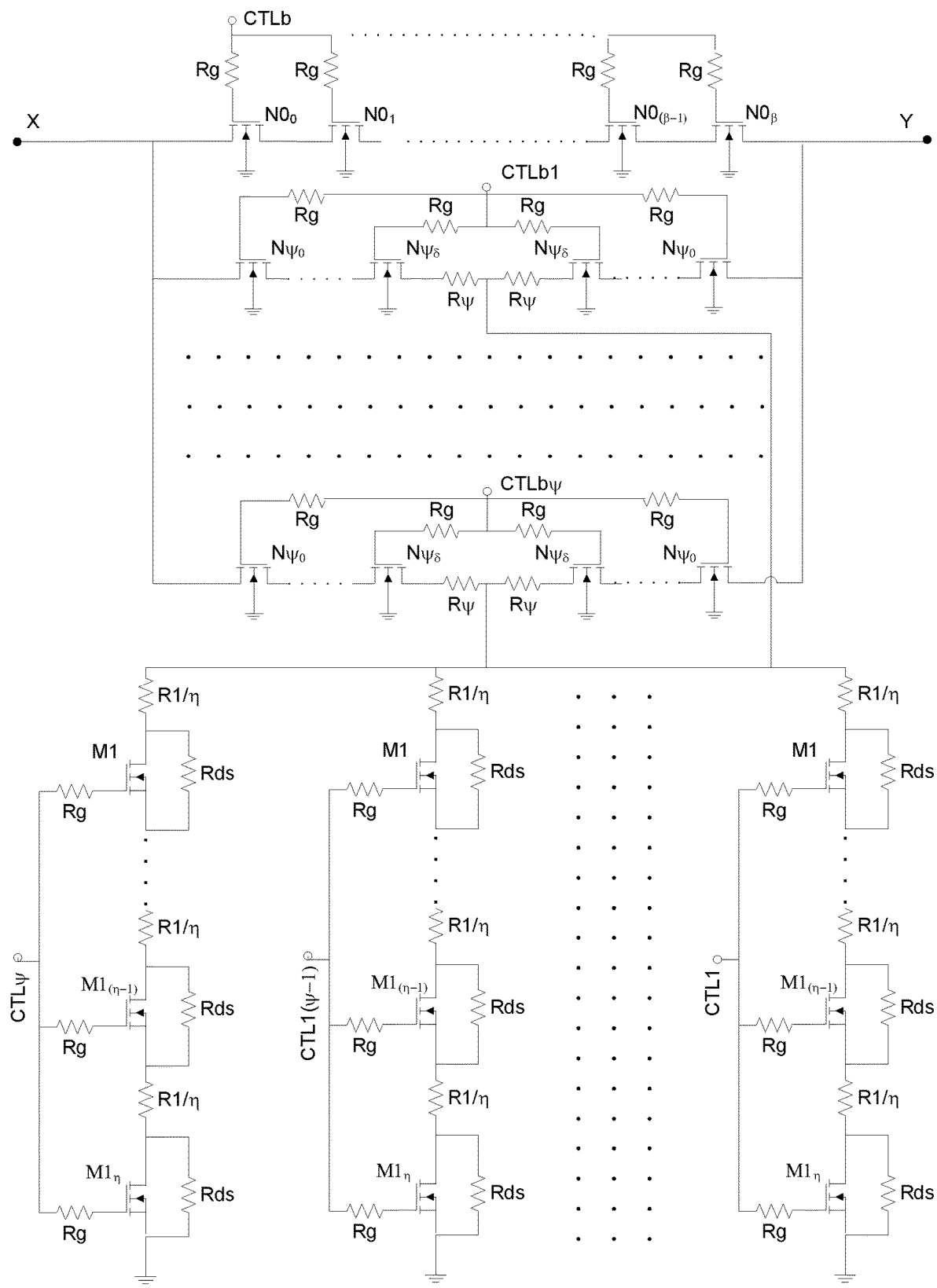
FIG. 12 illustrates an exemplary expandable tee attenuator implementation of a variable cell in a step attenuator in accordance with an embodiment of the invention.
Figure 13:
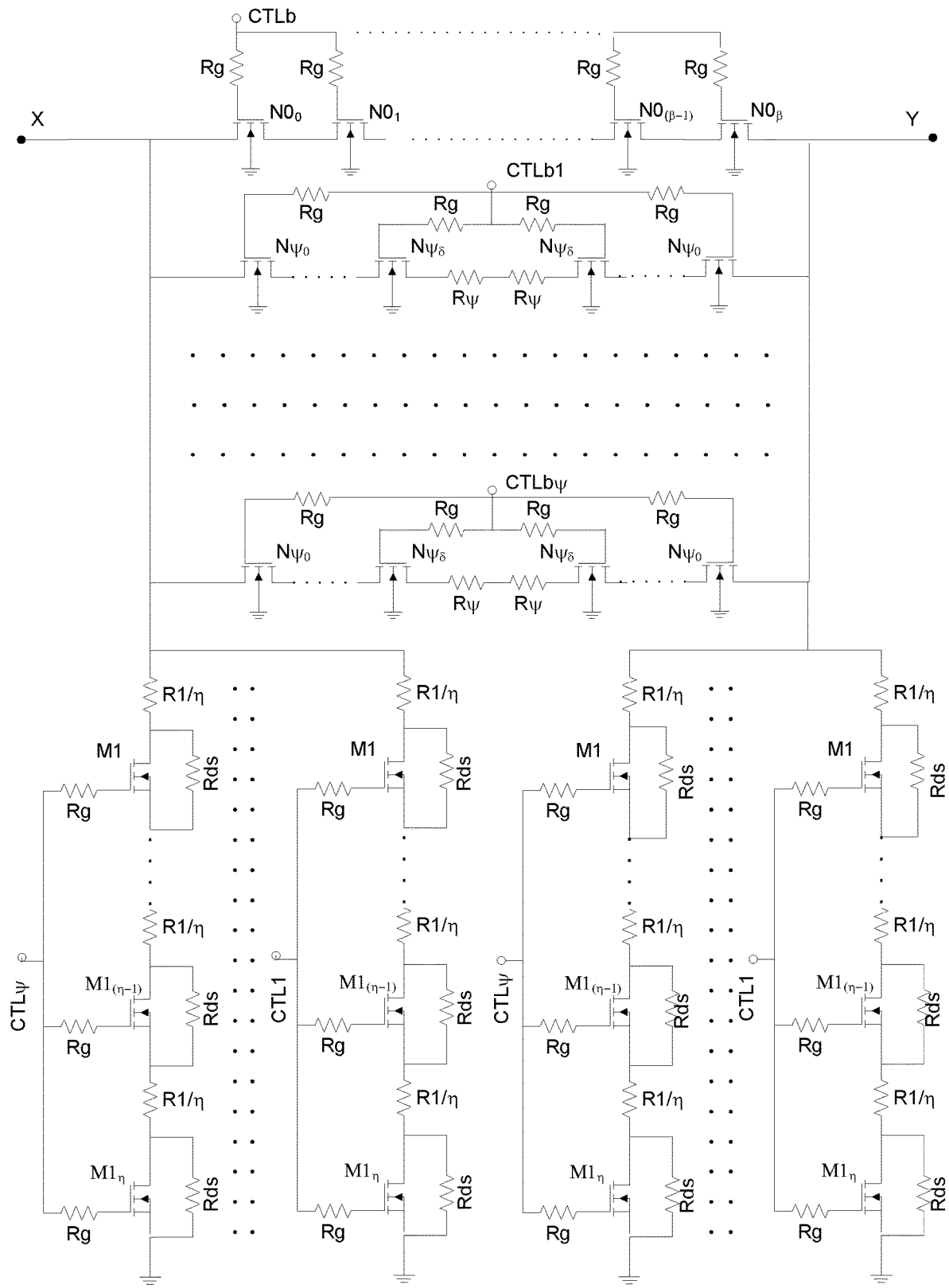
FIG. 13 illustrates an exemplary expandable pi attenuator implementation of a variable cell in a step attenuator in accordance with an embodiment of the invention.

FIGS. 11-13 illustrate that the many features discussed with regard to a multi-cell bridged tee attenuator are scalable and find applicability in other step attenuator architectures. FIG. 11 illustrates an exemplary expandable bridged tee attenuator implementation of a variable cell in a step attenuator in accordance with an embodiment of the invention. FIG. 12 illustrates an exemplary expandable tee attenuator implementation of a variable cell in a step attenuator in accordance with an embodiment of the invention. FIG. 13 illustrates an exemplary expandable pi attenuator implementation of a variable cell in a step attenuator in accordance with an embodiment of the invention.

FIGS. 11-13 further illustrate the unlimited number of variations in just three of many more types of step attenuators and step devices generally that can be made to suit many different embodiments. In these embodiments, X and Y represent input and output nodes, M identifies transistors in a shunt arm while N identifies transistors in bypass, bridge and series arms, $\psi$ represents the number of arms, $\beta$ represents the number of components (e.g. stacked components) in a bypass arm, $\rho$ represents the number of components in a bridge arm, $\delta$ represents the number of components in a series arm and $\eta$ represents the number of components in a shunt arm, Rds represents drain-source resistors, Rg represents gate resistors. CTL represents control signals, R or R0 represents series resistors, Rbridge represents bridge resistors, R1 represents shunt resistors, where, for example, R1/$\eta$ divides R1 by the number of components $\eta$ the shunt arm necessary to handle the voltage dropped across the attenuator when all attenuators are off and the device is in bypass mode. Ellipses in the form of vertical or horizontal dots indicate the number of components in an arm may vary or that the number of arms may vary.

One of ordinary skill in the art will recognize the operation of the embodiments presented in FIGS. 11-13. For brief illustration, the operation of the expandable multi-cell bridged tee attenuator illustrated in FIG. 11 is presented in Table 1. In this embodiment, bridge and shunt or series and shunt arms are selected in decreasing or increasing combinations, but in other embodiments components may be designed to select arms in the alternative or a mixture of combination and in the alternative.

TABLE 1

| | |
|---|---|
| State-0 (Attenuator OFF) | $N0_{0:\rho}$, $N1_{0:\rho}$:$N(\psi - 1)_{0:\rho}$ are ON $N(\psi)_{0:\rho}$, $M1_{0:\eta}$:$M(\psi - 1)_{0:\eta}$ are OFF |
| State-1 | $N1_{0:\rho}$:$N(\psi)_{0:\rho}$, $M1_{0:\eta}$ are ON $N0_{0:\rho}$, $M2_{0:\eta}$:$M(\psi - 1)_{0:\eta}$ are OFF |
| State-2 | $N2_{0:\rho}$:$N(\psi)_{0:\rho}$, $M1_{0:\eta}$:$M2_{0:\eta}$ are ON $N0_{0:\rho}$:$N1_{0:\rho}$, $M3_{0:\eta}$:$M(\psi - 1)_{0:\eta}$ are OFF |
| ... | ... |
| ... | ... |
| ... | ... |
| State-($\psi$ - 1) | $N (\psi - 2)_{0:\rho}$:$N(\psi)_{0:\rho}$, $M1_{0:\eta}$:$M(\psi - 1)_{0:\eta}$ are ON $N0_{0:\rho}$:$N (\psi - 3)_{0:\rho}$, $M(\psi - 1)_{0:\eta}$ are OFF |
| State-$\psi$ | $N(\psi - 1)_{0:\rho}$:$N(\psi)_{0:\rho}$, $M1_{0:\eta}$:$M(\psi - 1)_{0:\eta}$ are ON $N0_{0:\rho}$:$N (\psi - 2)_{0:\rho}$ are OFF |

Figure 14:
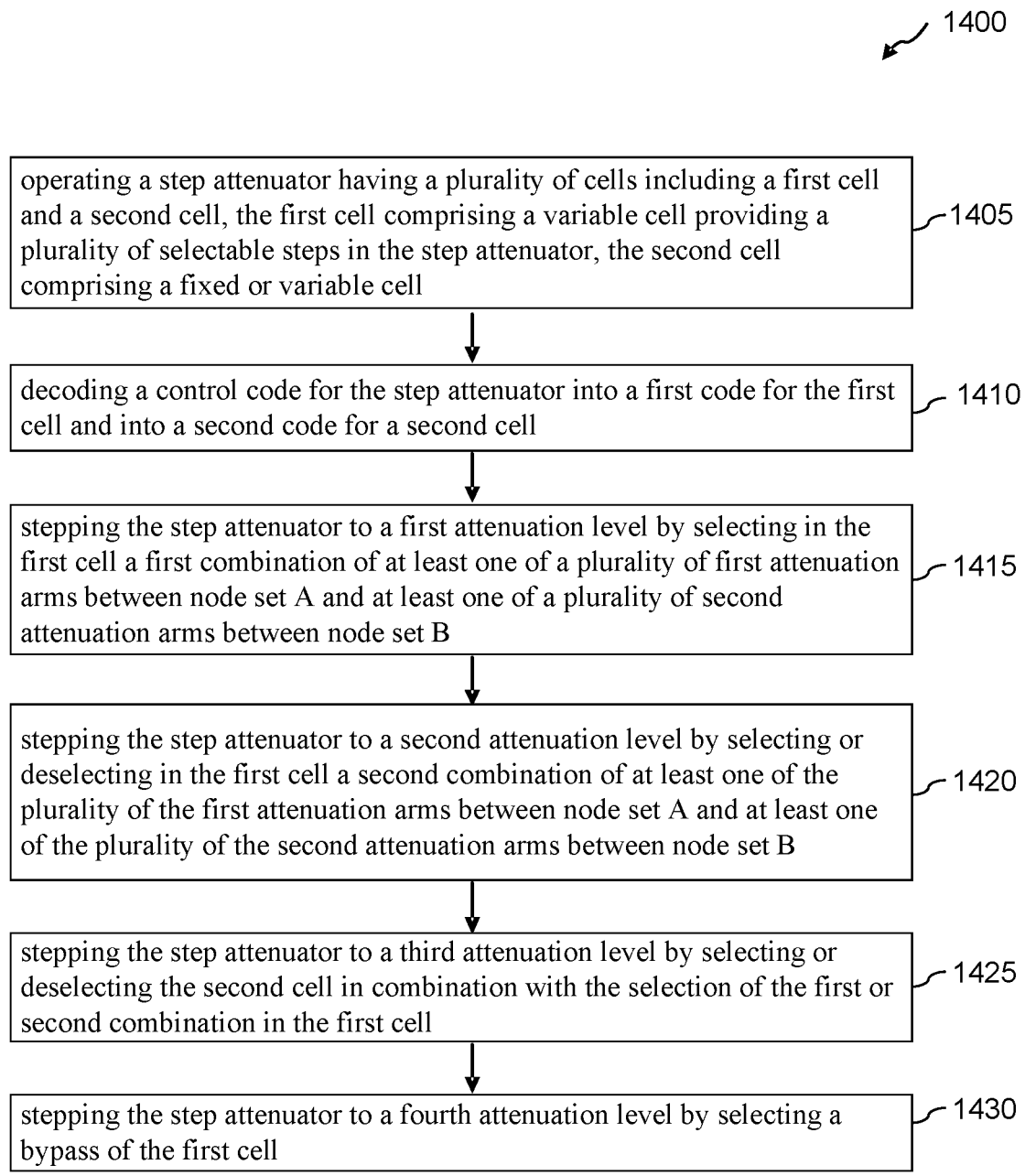
FIG. 14 illustrates an exemplary method in accordance with an embodiment of the invention.

Embodiments of the invention may also be implemented in processes or methods. For example, FIG. 14 illustrates an exemplary method in accordance with an embodiment of the invention. No order of steps is required unless expressly indicated or inherently required. There is no requirement that a method embodiment implement all of the steps illustrated in FIG. 14. FIG. 14 is simply one of many possible embodiments. Embodiments may implement fewer, more or different steps. Method 1400 in accordance with an embodiment of the invention comprises step 1405, operating a step attenuator having a plurality of cells including a first cell and a second cell, the first cell comprising a variable cell providing a plurality of selectable steps in the step attenuator, the second cell comprising a fixed or variable cell. One example of a variable cell is illustrated in FIG. 10. Additional examples of multi-cells are illustrated in FIGS. 11-13. Of course a step device may comprise any number of cells of any variety, fixed or variable. Cells may be variable or a hybrid of variable and fixed cells.

Method 1400 further comprises step 1410, decoding a control code for the step attenuator into a first code for the first cell and into a second code for a second cell. Inter-cell and intra-cell codes may be decoded from a control code. Intra-cell coding of the first cell may be the same or different than an intra-cell coding of the second cell. For example, some method embodiments may comprise applying a first code (e.g. thermometer code) to select steps in the first cell and applying a second code (e.g. binary or other code) to select steps in the second cell.

Method 1400 further comprises step 1415, stepping the step attenuator to a first attenuation level by selecting in the first cell a first combination of at least one of a plurality of first attenuation arms between node set A and at least one of a plurality of second attenuation arms between node set B. For example, step 1415 may be implemented by activating one of the 2 dB, 4 dB or 6 dB states in the multi-cell attenuator example discussed with reference to FIGS. 10 and 4A.

Method 1400 further comprises step 1420, stepping the step attenuator to a second attenuation level by selecting or deselecting in the first cell a second combination of at least one of the plurality of the first attenuation arms between node set A and at least one of the plurality of the second attenuation arms between node set B. For example, step 1420 may be implemented by activating one of the 2 dB, 4 dB or 6 dB states in the multi-cell attenuator example discussed with reference to FIGS. 10 and 4A so long as it is a different state than is activated in step 1410 within the same multi-cell.

Method 1400 further comprises step 1425, stepping the step attenuator to a third attenuation level by selecting or deselecting the second cell in combination with the selection of the first or second combination in the first cell. For example, step 1425 may be implemented by activating one of the 2 dB, 4 dB or 6 dB states in the multi-cell attenuator example discussed with reference to FIGS. 10 and 4A so long as it is a different state than is activated in step 1410 within the same multi-cell. For example, a step attenuator device may be stepped to a third attenuation level by selecting or deselecting any stage in any one of the fixed or variable cells illustrated in any one of FIG. 4A, 6A-B, 7A-C or 8A-C so long as it is the same step device and is a different cell than the cell selected to step to the first and second attenuation levels. This addresses the operation of step attenuator devices comprising a plurality of cells, including at least one multi-cell.

Method 1400 further comprises step 1430, stepping the step attenuator to a fourth attenuation level by selecting a bypass of the first cell. For example, step 1430 may be implemented by activating the bypass state in the multi-cell attenuator example discussed with reference to FIGS. 10 and 4A. This addresses the operation of multi-cells where a plurality of stages share a common bypass. Attenuation levels, including zero, may be obtained by bypassing one or more cells.

Hybrid-coding, multi-cell architecture and operating techniques for step devices provide advantages over binary-coded and thermometer-coded step devices by minimizing or avoiding glitches common in the transient response of binary-coded step devices and by minimizing or avoiding significant increases or degradation in one or more of area, package dimensions, pin counts, power consumption, insertion loss and parasitic capacitance common to thermometer-coded step devices having equivalent range and resolution.

As one example, compare the area required for three 2 dB cells versus one multi-cell having a range of 6 dB and resolution of 2 dB. Assume the average area of each transistor is 500 $\mu m^2$. Assume the average area of each resistor is 1000 $\mu m^2$. A single fixed 2 dB cell would have nine transistors, totaling 4,500 $\mu m^2$ (0.0045 $mm^2$) and six resistors, totaling 6,000 $\mu m^2$ (0.006 $mm^2$). The total area consumed by three 2 dB cells would be 0.0315 mm2. In this case, two addition ground pads (50 $\mu m \times 50$ $\mu m$ each) would also be required, bringing the total area up to 0.032 $mm^2$. In contrast, a multi-cell with 6 dB range and 2 dB resolution would have nineteen transistors, totaling 9,500 $\mu m^2$ (0.0095 $mm^2$) and 14 resistors, totaling 14,000 $\mu m^2$ (0.014 $mm^2$). The total area consumed by the multi-cell would be 0.0235 $mm^2$. Comparing total area consumed, it is clear that the multi-cell reduces area, in this example by approximately 36%. It should also be clear that since the multi-cell uses only two bypass devices, as opposed to a total of six bypass devices for the three fixed 2 dB cells, the multi-cell also reduces insertion loss.

Multi-cells may also improve component matching and overall performance. The multi-cell improves matching because resistors are grouped internally within its cell. With good design methodologies, resistor values in a multi-cell can be set so that either a series, parallel, or series-parallel combination of a unit resistor can be used to match (or approximate) all values needed in the cell. For example, assume the bridge resistors Rbridge1, 2, 3 in FIG. 10, were 30 Ω, 15Ω and 10Ω resistors. 30Ω unit resistors can be used to achieve all these values. The same method applies to the shunt arm. Since multiple unit resistors can be used, highly matched unit resistor arrays can be achieved. This not only yields superb attenuation accuracy, but it also desensitizes the design to process variations.

A device, as defined herein, is a machine or manufacture as defined by 35 U.S.C. §101. A device may comprise, for example but not limited to, an amplifier, attenuator, digital step attenuator, intermediate frequency (IF) device, radio frequency (RF) device, wireless device, communications device, radio system, receiver, transmitter, transceiver, cellular base station equipment and other communications and wireless infrastructure equipment, etc. For example, embodiments of the invention can be implemented in one or more IF and RF stages of receivers, transmitters and transceivers. Devices may be digital, analog or a combination thereof. Digital devices may have one or a plurality of programming modes, e.g., serial, parallel, latched parallel, for a plurality of different programming and control implementations.

Techniques, including methods, described herein may be implemented in hardware (digital and/or analog) or a combination of hardware, software and/or firmware. Techniques described herein may be implemented in one or more components. Embodiments of the invention may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments of the present invention described herein.

Proper interpretation of subject matter described herein and claimed hereunder is limited to patentable subject matter under 35 U.S.C. § 101. Subject matter described in and claimed based on this patent application is not intended to and does not encompass unpatentable subject matter. As described herein and claimed hereunder, a method is a process defined by 35 U.S.C. § 101. As described herein and claimed hereunder, each of a circuit, device, converter, apparatus, machine, system, computer, module, media and the like is a machine and/or manufacture defined by 35 U.S.C. § 101.

While the present invention has been described with respect to a limited number of embodiments, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the invention. The exemplary appended claims encompass embodiments and features described herein, modifications and variations thereto as well as additional embodiments and features that fall within the true spirit and scope of this present invention.

What is claimed:

1. A method comprising:
   operating a step device comprising:
      a first variable cell that is independently deselectable and selectable to provide a first plurality of steps;
      a second variable cell that is independently deselectable and selectable to provide a second plurality of steps; and
   stepping the step device between a plurality of selectable steps using at least the first and second plurality of steps with a maximum step size that is less than a maximum binary step size and greater than a maximum thermometer step size for an equivalent range and resolution of levels, wherein the maximum step size is configured to cause a smaller maximum glitch than the maximum binary step size.

2. The method of claim 1, the step device comprising a plurality of cells comprising at least the first variable cell and the second variable cell, each cell being selectable to provide, alone or in combination with other cells, one or more of the plurality of selectable steps.

3. The method of claim 2, wherein stepping the step device between a plurality of selectable steps comprises at least one of selecting or deselecting one or more steps in the first variable cell.

4. The method of claim 3, wherein an intercell coding of the plurality of cells is hybrid and an intra cell coding of the first variable cell is thermometer, binary or hybrid.

5. The method of claim 4, wherein an intra cell coding of the second variable cell is thermometer, binary or hybrid and is different from the intra cell coding of the first variable cell.

6. The method of claim 4, wherein the first variable cell and the second variable cell have at least one of a different cell range and a different cell resolution.

7. The method of claim 3, wherein the selecting or deselecting the one or more steps in the first variable cell comprises selecting a first cell in the first variable cell and deselecting a second cell in the first variable cell.

8. The method of claim 3, wherein the plurality of cells comprise a hybrid of fixed and variable cells.

9. A method comprising:
   operating a hybrid coded or hybrid codable step device comprising:
      a first variable cell that is independently deselectable and selectable to provide a first plurality of steps;
      a second variable cell that is independently deselectable and selectable to provide a second plurality of steps; and
   stepping the hybrid coded or hybrid codable step device at least one step in a plurality of selectable steps, wherein the hybrid coded or hybrid codable step device causes a smaller maximum glitch than a binary coded step device.

10. The method of claim 9, wherein operating the hybrid coded or hybrid codable step device comprises:
    controlling the first variable cell having a cell range with a cell resolution that provides, alone or in combination with one or more other cells, a plurality of the plurality of selectable steps.

11. The method of claim 10, wherein operating the hybrid coded or hybrid codable step device further comprises:
    controlling the second variable cell having a cell range with a cell resolution that provides, alone or in combination with one or more other cells, a plurality of the plurality of selectable steps, wherein the first variable cell and the second variable cell have at least one of a different cell range and a different cell resolution.

12. The method of claim 11, wherein operating the hybrid coded or hybrid codable step device further comprises:
    using a hybrid code to step the step device;
    using a hybrid code, a binary code or a thermometer code to select steps in the first variable cell; and
    using a hybrid code, a binary code or a thermometer code to select steps in the second variable cell.

13. The method of claim 10, further comprising:
    stepping between the first plurality of steps in the first variable cell with the cell resolution between the first plurality of steps being variable or nonuniform.

14. A device comprising:
    a first variable cell that is independently deselectable and selectable to provide a first plurality of steps; and
    a second variable cell that is independently deselectable and selectable to provide a second plurality of steps;
    wherein the device is configured to step between a plurality of selectable steps using at least the first and second plurality of steps with a maximum step size that is less than a maximum binary step size and greater than a maximum thermometer step size for an equivalent range and resolution of steps, wherein the maximum step size is configured to cause a smaller maximum glitch than the maximum binary step size.

15. The device of claim 14, the device comprising a plurality of cells controllable to provide the plurality of selectable steps, the plurality of cells comprising the first variable cell and the second variable cell, wherein the first variable cell comprises a first range and resolution of steps and the second variable cell comprises a second range and resolution of steps, where at least one of the second range and the second resolution is different from the first range or the first resolution.

16. The device of claim 15, where the device is configured to step at least one of the plurality of selectable steps by selecting or deselecting the second variable cell in combination with selecting or deselecting the first cell.

17. The device of claim 15, where the device is configured to step at least one of the plurality of steps by selecting a bypass of the first variable cell to deselect the first variable cell.

18. The device of claim 14, the device comprising a plurality of cells controllable to provide the plurality of selectable steps, the plurality of cells comprising the first variable cell and the second variable cell, the device being configured as hybrid-coded or hybrid codable with a first code applicable to the first variable cell and a second code applicable to the second variable cell, where the first and second codes are different.

19. The device of claim 18, wherein the first code is a thermometer code.

20. The device of claim 18, where the device is configured to decode a control code for a step attenuator into the first code for the first variable cell and into the second code for the second variable cell.

* * * * *